United States Patent
Lin et al.

(10) Patent No.: US 12,557,575 B2
(45) Date of Patent: Feb. 17, 2026

(54) METHODS FOR REDUCING LEAKAGE CURRENT

(71) Applicant: Taiwan Semiconductor Manufacturing Company, Hsinchu (TW)

(72) Inventors: Tzu-Ging Lin, Kaohsiung (TW); Yi-Chun Chen, Hsinchu (TW); Chieh-Ning Feng, Taichung (TW); Jih-Jse Lin, Sijhih (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 370 days.

(21) Appl. No.: 18/093,227

(22) Filed: Jan. 4, 2023

(65) Prior Publication Data

US 2024/0213029 A1 Jun. 27, 2024

Related U.S. Application Data

(60) Provisional application No. 63/434,702, filed on Dec. 22, 2022.

(51) Int. Cl.
 *H01L 21/3065* (2006.01)
 *H01L 21/311* (2006.01)
 *H01L 21/762* (2006.01)

(52) U.S. Cl.
 CPC .... *H01L 21/3065* (2013.01); *H01L 21/76224* (2013.01); *H01L 21/31116* (2013.01)

(58) Field of Classification Search
 None
 See application file for complete search history.

(56) References Cited

U.S. PATENT DOCUMENTS

| | | | | |
|---|---|---|---|---|
| 2018/0166293 A1* | 6/2018 | Tsai | | H01L 21/3081 |
| 2020/0006557 A1* | 1/2020 | Ko | | H10D 30/024 |
| 2020/0273711 A1* | 8/2020 | Yoshida | | H01L 21/31111 |
| 2021/0066087 A1* | 3/2021 | Nagamitsu | | H10D 30/024 |
| 2021/0343597 A1* | 11/2021 | Ko | | H10D 62/151 |
| 2021/0376072 A1* | 12/2021 | Yu | | H10D 62/115 |
| 2022/0328344 A1* | 10/2022 | Yu | | H01L 21/76805 |

FOREIGN PATENT DOCUMENTS

TW 202145358 A 12/2021

OTHER PUBLICATIONS

Taiwan Office Action Application No. 11320429710 Dated: May 3, 2024.

\* cited by examiner

*Primary Examiner* — Joshua L Allen
*Assistant Examiner* — Andrew Keelan Laobak
(74) *Attorney, Agent, or Firm* — Lippes Mathias LLP

(57) ABSTRACT

Methods for forming a CPODE structure with reduced leakage current are disclosed herein. The CPODE structure is formed by etching away a pair of fins and forming a pair of trenches in the substrate where the pair of fins was originally located. A leakage path may be present in the area between the pair of fins. The etching is performed by cycling continuously plasma etch until the trenches are formed. The plasma etch removes any byproducts that may be formed during the fin etch which could reduce or stop the etching of the fins, the area between the pair of fins, and the substrate.

20 Claims, 25 Drawing Sheets

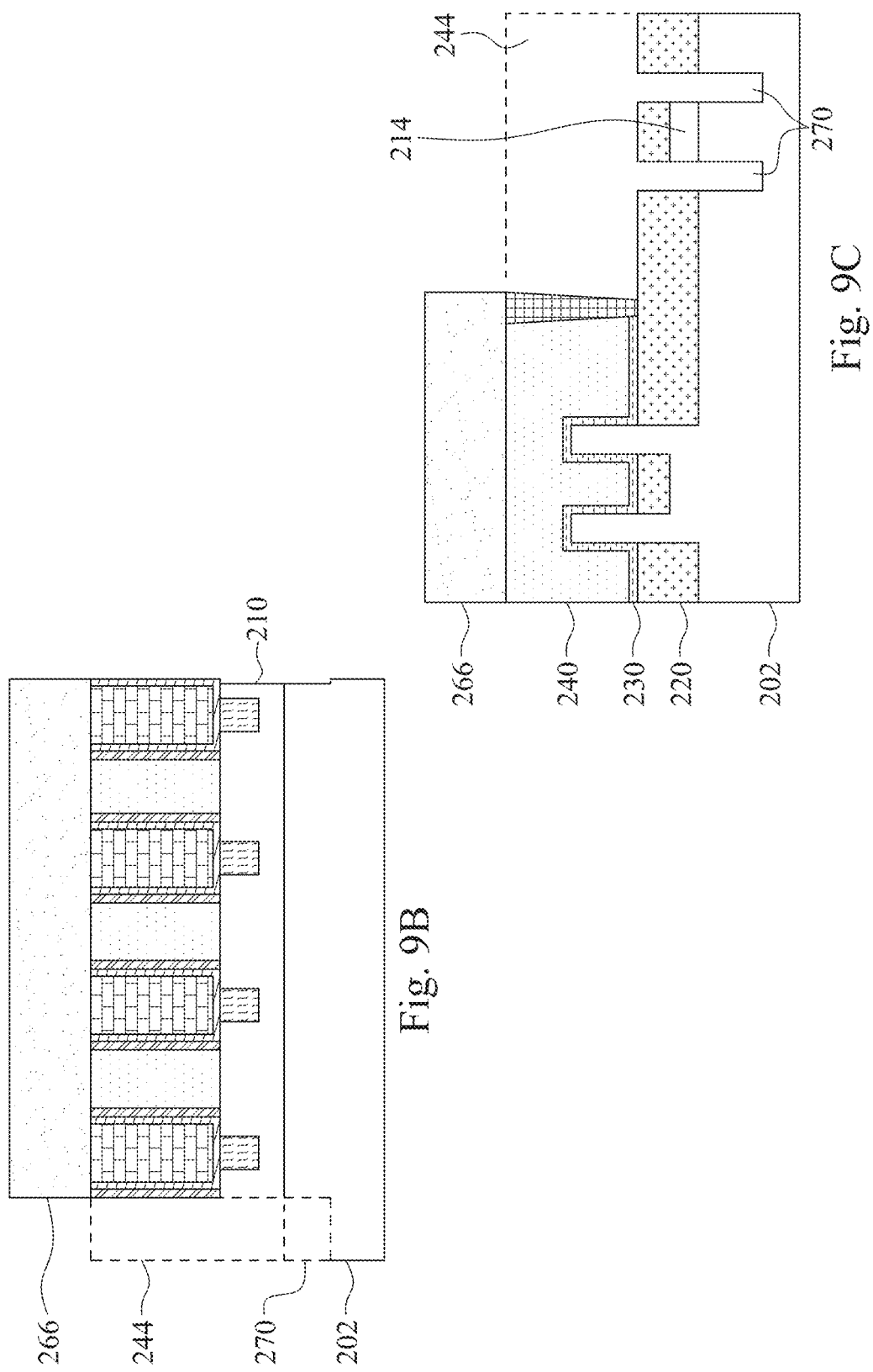

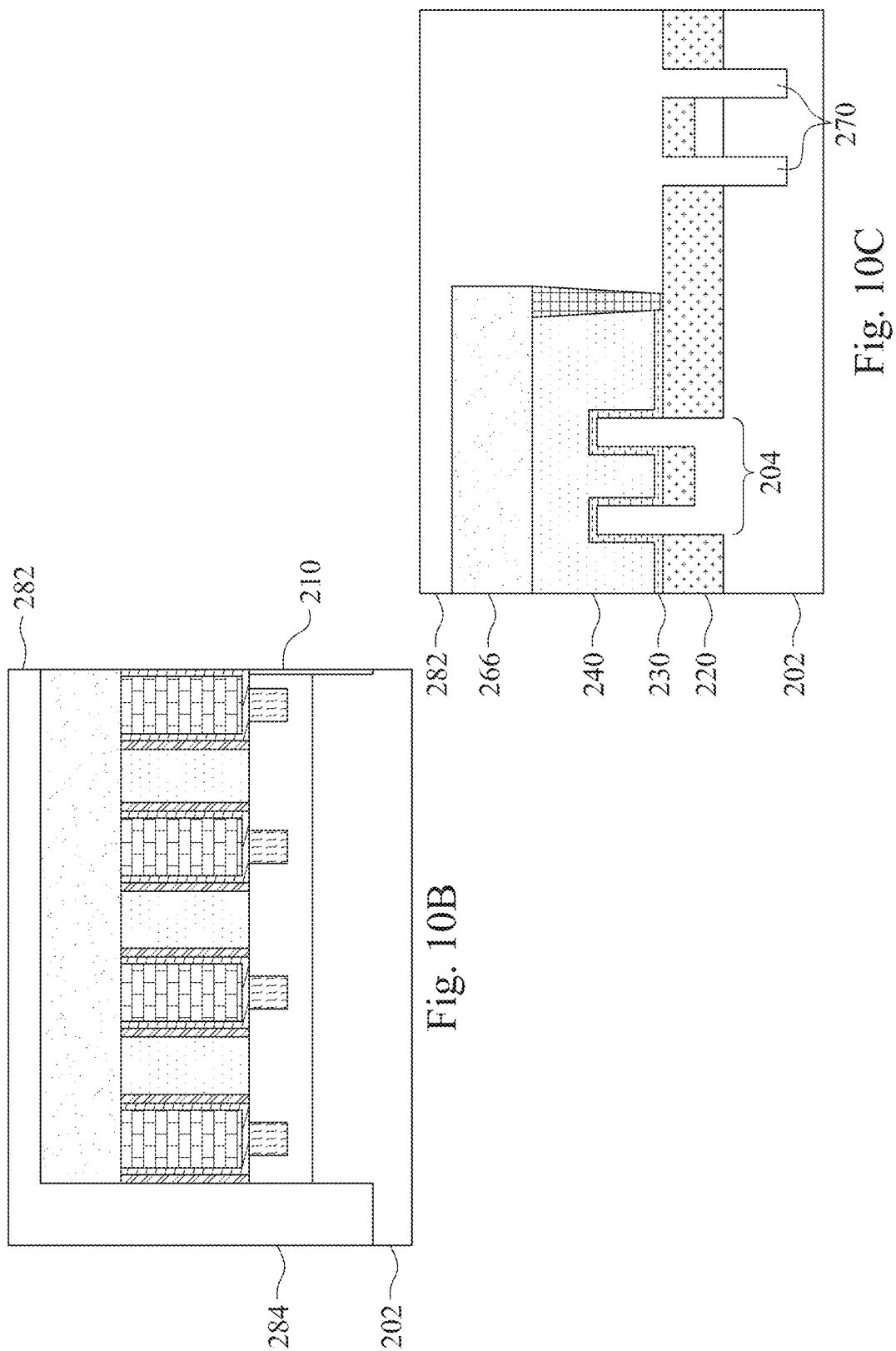

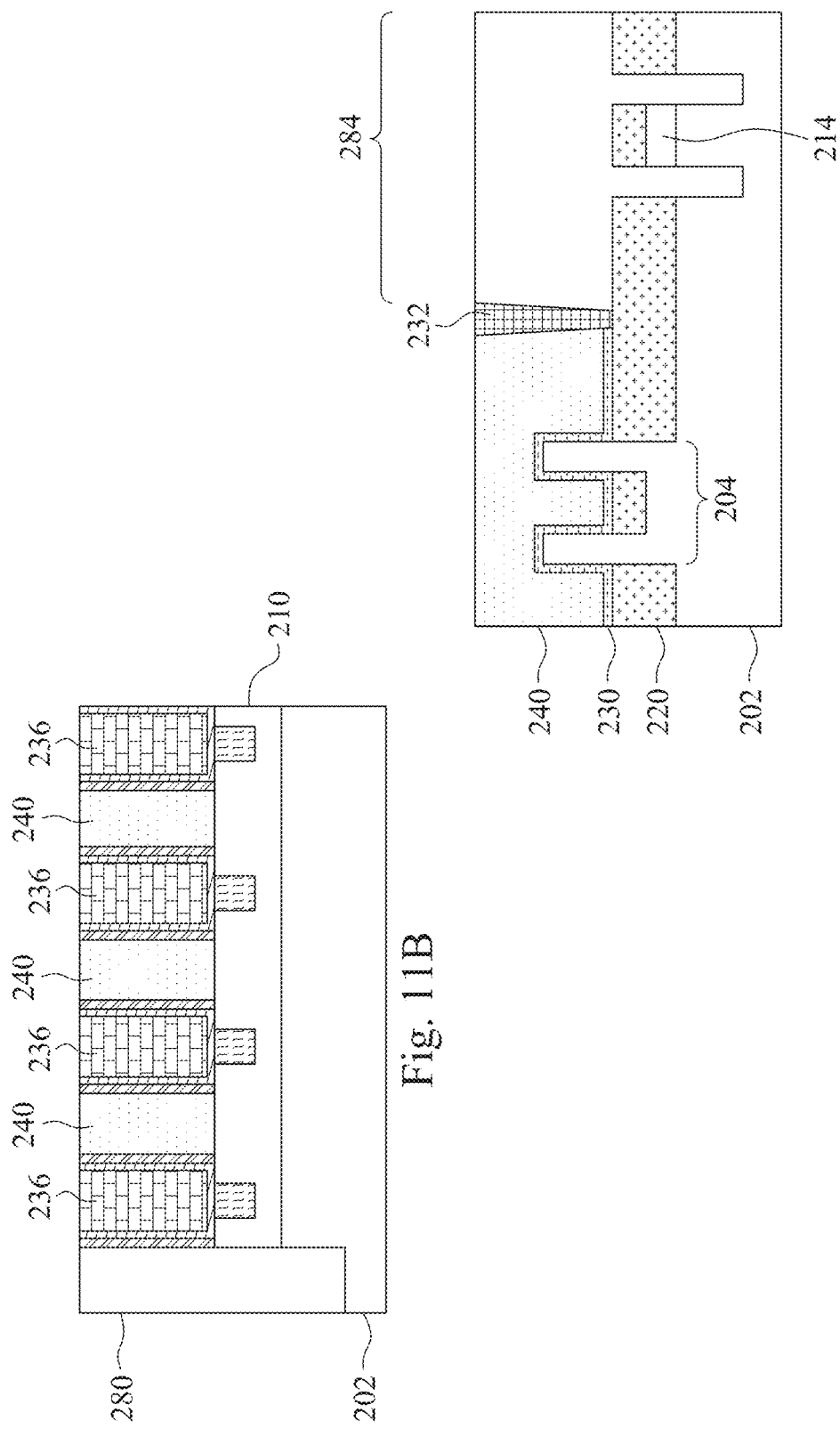

METHODS FOR REDUCING LEAKAGE CURRENT

CROSS-REFERENCE TO RELATED APPLICATIONS

This application claims priority to U.S. Provisional Patent Application Ser. No. 63/434,702, filed on Dec. 22, 2022, which is incorporated by reference in its entirety.

BACKGROUND

Integrated circuits are formed on a semiconductor wafer. Photolithographic patterning processes use ultraviolet light to transfer a desired mask pattern to a photoresist on a semiconductor wafer. Etching processes may then be used to transfer to the pattern to a layer below the photoresist. This process is repeated multiple times with different patterns to build different layers on the wafer substrate and make a useful device.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 2A is a perspective view. FIG. 2B is an X-axis view through line B-B. FIG. 2C is a Y-axis view through line C-C.

FIG. 3A is a perspective view. FIG. 3B is an X-axis view. FIG. 3C is a Y-axis view.

FIG. 4A is a perspective view. FIG. 4B is an X-axis view. FIG. 4C is a Y-axis view.

FIG. 5A is a perspective view. FIG. 5B is an X-axis view. FIG. 5C is a Y-axis view.

FIG. 6A is a perspective view. FIG. 6B is an X-axis view. FIG. 6C is a Y-axis view.

FIG. 7A is a perspective view. FIG. 7B is an X-axis view. FIG. 7C is a Y-axis view.

FIG. 8A is a perspective view. FIG. 8B is an X-axis view. FIG. 8C is a Y-axis view.

FIGS. 9A-9C are different views of a processing step. FIG. 9A is a perspective view. FIG. 9B is an X-axis view. FIG. 9C is a Y-axis view.

FIGS. 10A-10C are different views of a processing step. FIG. 10A is a perspective view. FIG. 10B is an X-axis view. FIG. 10C is a Y-axis view.

FIGS. 11A-11C are different views of a processing step. FIG. 11A is a perspective view. FIG. 11B is an X-axis view. FIG. 11C is a Y-axis view.

DETAILED DESCRIPTION

Figure 1:
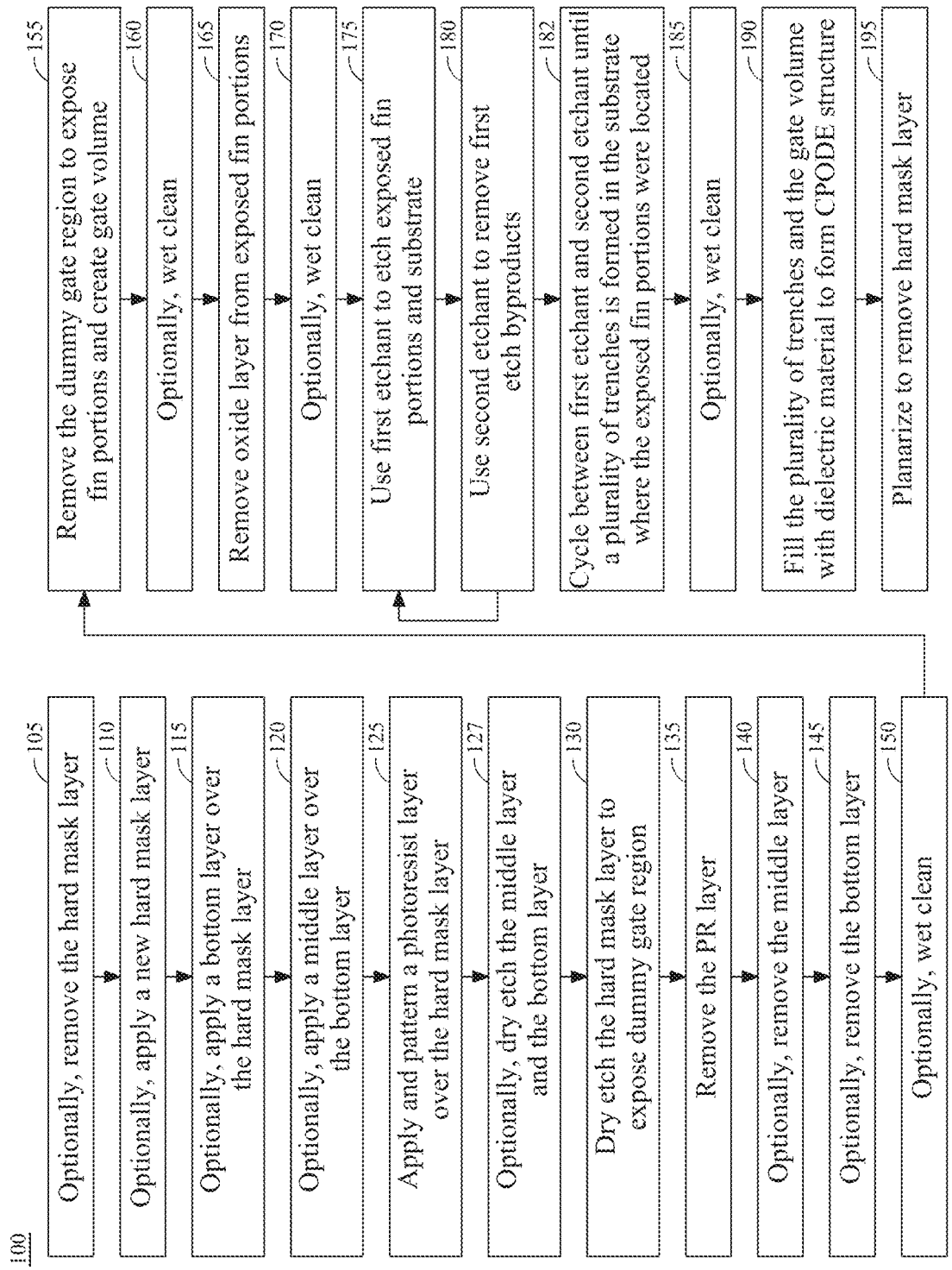
FIG. 1 is a flow chart illustrating a method for reducing leakage current in an integrated circuit, in accordance with some embodiments. This is done by isolating a leakage path below a shallow trench isolation region, through formation of a CPODE pattern.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Numerical values in the specification and claims of this application should be understood to include numerical values which are the same when reduced to the same number of significant figures and numerical values which differ from the stated value by less than the experimental error of conventional measurement technique of the type described in the present application to determine the value. All ranges disclosed herein are inclusive of the recited endpoint.

The term "about" can be used to include any numerical value that can vary without changing the basic function of that value. When used with a range, "about" also discloses the range defined by the absolute values of the two endpoints, e.g. "about 2 to about 4" also discloses the range "from 2 to 4." The term "about" may refer to plus or minus 10% of the indicated number.

The present disclosure relates to structures which are made up of different layers. When the terms "on" or "upon" are used with reference to two different layers (including the substrate), they indicate merely that one layer is on or upon the other layer. These terms do not require the two layers to directly contact each other, and permit other layers to be between the two layers. For example all layers of the structure can be considered to be "on" the substrate, even though they do not all directly contact the substrate. The term "directly" may be used to indicate two layers directly contact each other without any layers in between them.

The present disclosure relates to various methods for improving the performance of an integrated circuit by reducing leakage current, especially leakage current through a continuous poly on diffusion edge (CPODE) structure. In this regard, a CPODE structure or pattern may be used as an electrically insulating or dielectric feature on the wafer. This provides electrical isolation between neighboring active device regions, such as transistors. This may be useful in reducing parasitic capacitance between active device regions, which increases processing speed. A CPODE structure can also be used as a vertically-oriented capacitor.

In this regard, the leakage path through the CPODE structure may be present below a shallow trench isolation (STI) layer or region. The CPODE structure is formed by etching away a pair of fins and forming a pair of trenches in the substrate where the pair of fins was originally located. The leakage path may be present in the area between the pair of fins, as will be further explained. The removal of the fins and substrate to form the trenches is performed by cycling continuously between two different etchants, a fin etchant and a plasma etch. The fin etchant removes the fins and the substrate to form the trenches. Byproducts of the fin etch may form a protective layer on the exposed fins and substrate, reducing the efficacy of continuous fin etching. The use of the plasma etch removes any byproducts that may be formed during the fin etch, enhancing subsequent fin etching.

FIG. 1 is a flow chart illustrating a method 100 for reducing the leakage current, in accordance with some embodiments. Some steps of the method are also illustrated in FIGS. 2A-11C. These figures provide different views for better understanding. The figures having an A suffix, i.e. FIGS. 2A-11A, are perspective views. The figures having a B suffix, i.e. FIGS. 2B-11B, are X-axis views taken along line B-B of FIG. 2A. The figures having a C suffix, i.e. FIGS. 2C-11C, are Y-axis views taken along line C-C of FIG. 2A.

Figure 2A:
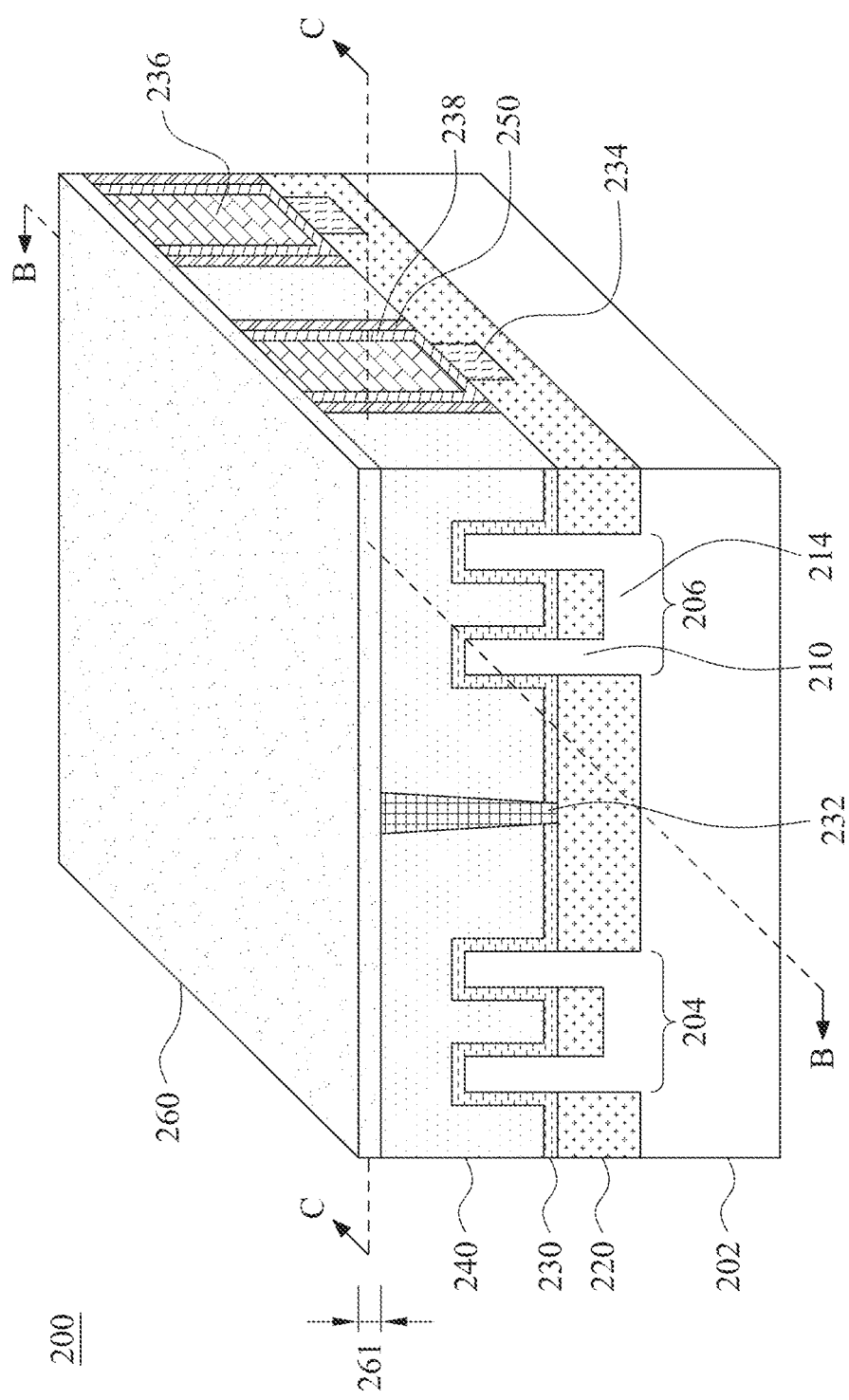
FIGS. 2A-2C are different views of a processing step.
Figure 2B:
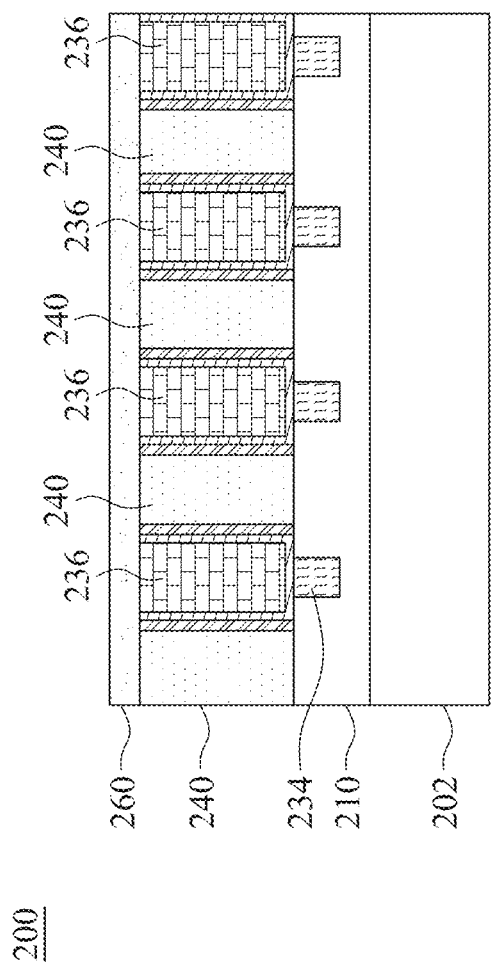
Figure 2C:
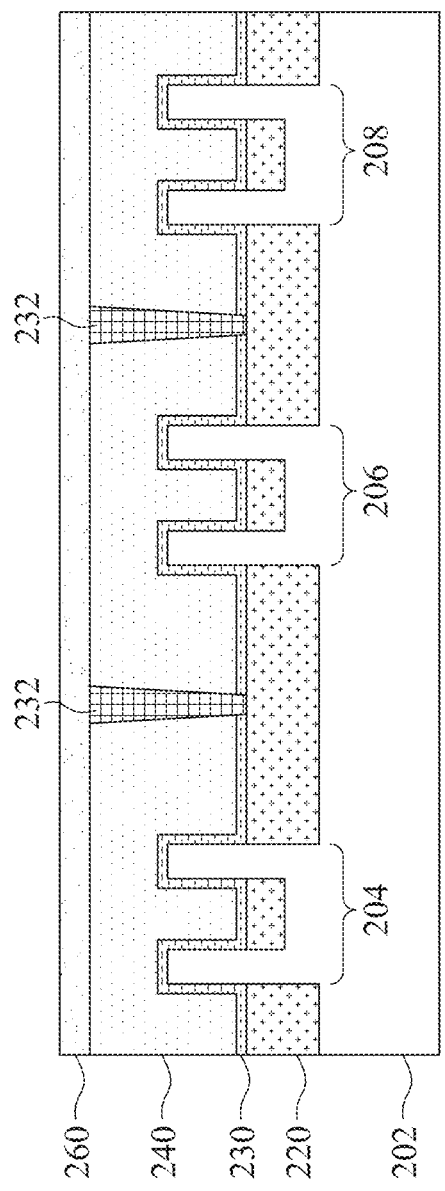

Referring first to FIGS. 2A-2C, these figures show a beginning state of the integrated circuit 200, before the CPODE structure is formed. The integrated circuit is built upon a substrate 202. The substrate is usually a wafer made of a semiconducting material. Such materials can include silicon, for example in the form of crystalline Si or polycrystalline Si. In alternative embodiments, the substrate can be made of other elementary semiconductors such as germanium, or may include a compound semiconductor such as silicon carbide (SiC), gallium arsenide (GaAs), gallium carbide, gallium phosphide, indium arsenide (InAs), indium phosphide (InP), silicon germanium, silicon germanium carbide, gallium arsenic phosphide, or gallium indium phosphide. In particular embodiments, the wafer substrate is silicon.

In FIG. 2A and FIG. 2B, two pairs 204, 206 of fins are shown. FIG. 2C is further extended along the Y-axis, and shows three pairs 204, 206, 208 of fins. The fins will be used in a FinFET (field effect transistor), which permits the use of higher current in the transistor. The fins 210 themselves are typically formed by patterning a hard mask and subsequent anisotropic etching of the wafer substrate 202, and thus are made of the same material as the substrate. However, depending on the fin pitch and the fin width, it is difficult to control the etching between the two fins when they are very close to each other (i.e. low fin pitch and low fin width). As a result, there is extra material located between the fins, which is indicated with reference numeral 214. Put another way, the substrate is not etched as deeply between the fins as outside of the fins.

Continuing, a shallow trench isolation (STI) region or layer 220 is present above the substrate 202 between the fin pairs 204, 206, 208 and between the fins 210 themselves. The dielectric material in the STI layer is commonly silicon dioxide, although other dielectric materials can also be used such as undoped polysilicon, silicon oxide (e.g. $SiO_2$), silicon nitride, silicon oxynitride, fluoride-doped silicate glass, or other low-k dielectric material. The deposition can be done using physical vapor deposition (PVD) or chemical vapor deposition (CVD) or spin-on processes known in the art, or can be grown via oxidation. If desired, the dielectric material can be deposited to a level above that of the fins, then recessed back down to the desired height by etching (prior to removal of the hard mask which protects the fins from such etching).

Next, an I/O oxide layer 230 is present, which covers the fins 210 above the STI layer and the STI layer 220 itself. This can be applied using ALD, CVD, or other deposition processes. The I/O oxide layer is commonly made from a silicon oxide.

Neighboring pairs of fins are separated by a vertically-oriented isolation dielectric structure 232. FIG. 2C shows two isolation dielectric structures 232, and the CPODE structure will be formed between them. Common materials for the isolation dielectric structures include silicon nitride and a silicon oxide.

Referring now to FIG. 2B, source/drain regions or electrodes 234 are present which intersect the fins 210. In some embodiments, the source/drain regions can be formed via ion implantation. Briefly, an ion implanter is used to implant atoms into a silicon crystal lattice, modifying the conductivity of the lattice in the implanted location. Common p-type dopants may include boron, gallium, or indium. Common n-type dopants may include phosphorus or arsenic. Annealing may also occur. Alternatively, etching may be performed and deposition of electrically conductive metals such as TIN, Pt, Co, Rh, Pd, Ti, Ta, and the like can be used to form the source/drain regions.

The source/drain electrodes 234 are located below interlayer dielectric (ILD) regions 236. The ILD regions electrically separate the source/drain regions from the final gate terminals or electrodes. The ILD regions may be formed from any dielectric material, and do not need to be a high-k dielectric material. Suitable dielectrics could include silicon nitride, a silicon oxide (e.g. $SiO_2$), phosphosilicate glass (PSG), fluorosilicate glass (FSG), undoped silicate glass (USG), high-stress undoped silicate glass (HSUSG), borosilicate glass (BSG), or any combination thereof. The ILD can be deposited using any appropriate method, for example CVD. The ILD regions 236 are surrounded on three sides by a continuous etch stop layer (CESL) 238. The CESL is commonly made from silicon nitride.

Located between ILD regions are dummy gate regions 240. The dummy gate region is typically formed from polysilicon, and is used to define the shape of the final gate terminal or electrode. The vertical surfaces of the dummy gate regions 240 are covered with a low-k dielectric layer 250 having a dielectric constant equal to or less than that of silicon nitride (~7). Suitable materials may include various nitrides or oxides. CPODE structures are typically formed where a dummy gate region is located. The Y-axis views of FIGS. 2C-11C are taken through a dummy gate region.

Finally, a hard mask layer 260 is present and covers the surface of the substrate. Silicon nitride is commonly used as the hard mask layer. As indicated in FIG. 2C, the hard mask layer 260 has a thickness 261.

The structure illustrated in FIGS. 2A-2C may be formed by starting with the wafer substrate 202 itself. A hard mask is applied and patterned, and the substrate is then etched to form the fins 210. A dielectric material is then deposited to form the STI layer 220. Next, the I/O oxide layer 230 is formed, either by deposition and etch or by thermal oxidation or other suitable process. A thick polysilicon layer is then deposited across the substrate. A photoresist (PR) layer is applied and patterned, and the polysilicon layer is etched to form channels in the Y-axis, which are then filled with a dielectric material to form the vertical isolation dielectric regions 232. A new PR layer is applied and patterned, and the polysilicon layer is then etched to form large channels that will eventually become the ILD regions.

Next, the low-k dielectric layers 250 are applied to the exposed vertical surfaces of the polysilicon layer within the large channels. This could be done either by deposition and etch or by thermal oxidation or other suitable process. Ion implantation is subsequently performed to form the source/drain regions 234. The CESL 238 is then applied to the large channels to cover the exposed surfaces. A dielectric material is then applied to fill the large channels and form the ILD regions 236. The PR layer is then removed. Planarization may be performed, and the hard mask layer 260 is then applied.

Referring now to FIG. 1 and FIGS. 2A-2C, the thickness 261 of the hard mask layer from prior processing steps may not be sufficiently thick for the subsequent processing steps for forming the CPODE structure. If that is the case, then the hard mask layer is "pulled back" or removed, and then refilled.

Figure 3A:
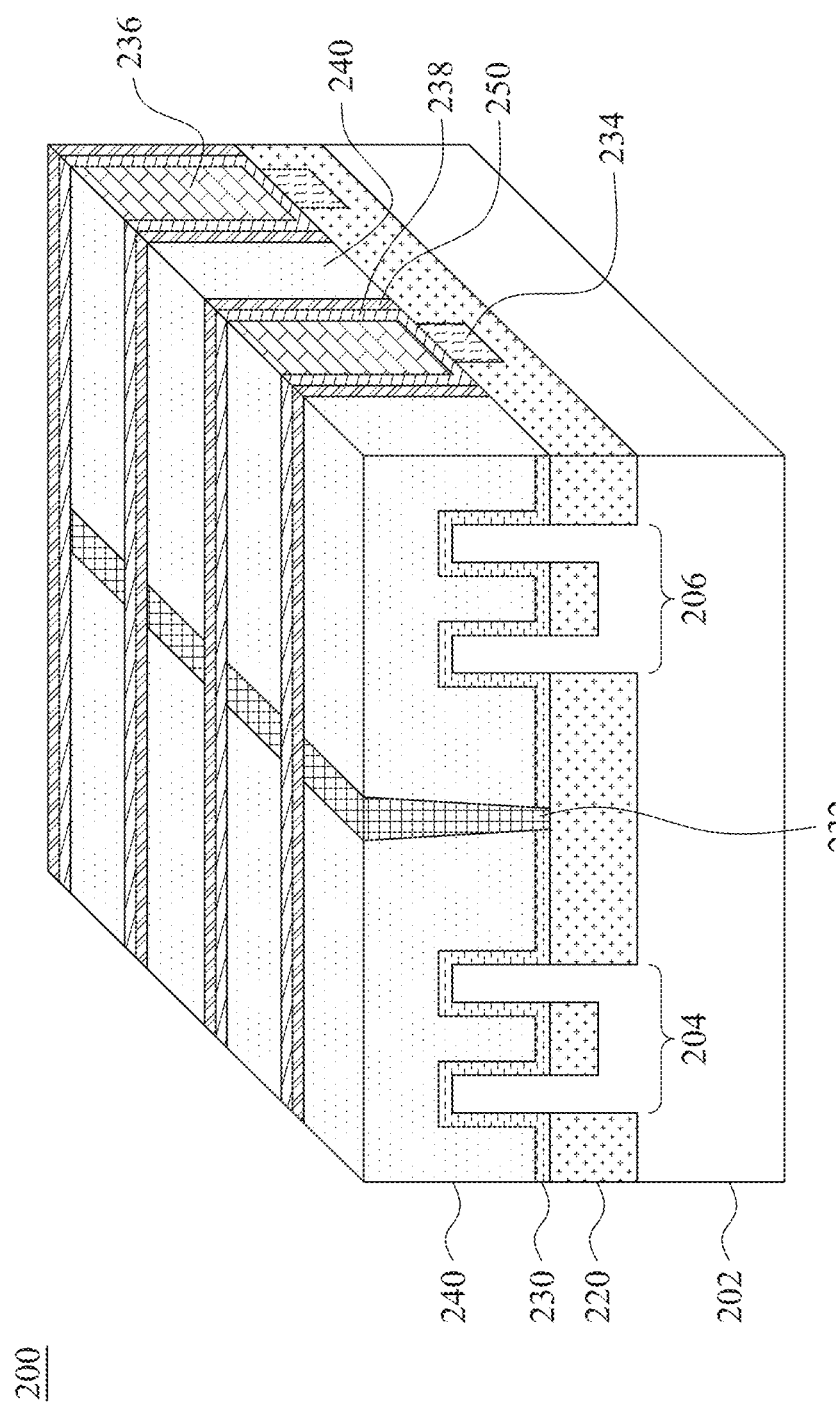
FIGS. 3A-3C are different views of a processing step.
Figure 3B:
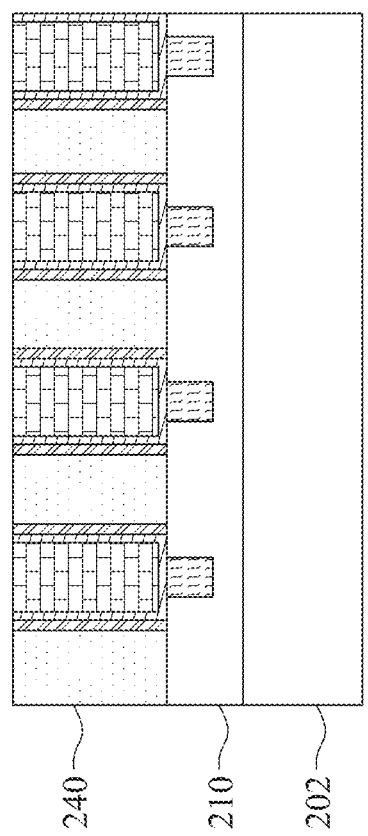
Figure 3C:
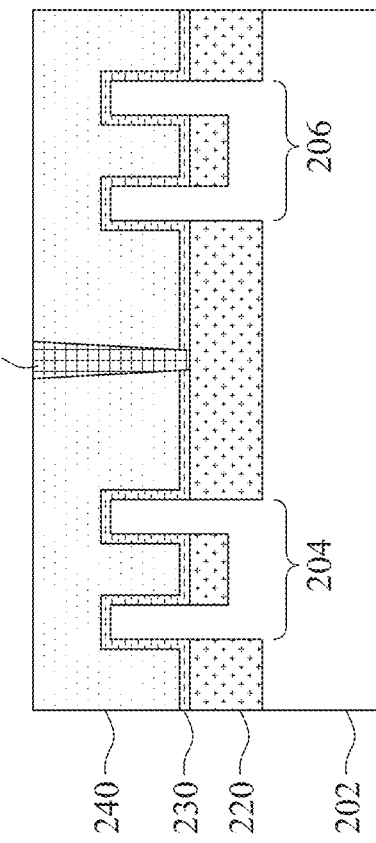

In optional step 105, the hard mask layer 260 is removed. This can be done by etching or chemical-mechanical planarization (CMP). The resulting structure is shown in FIGS. 3A-3C.

Figure 4A:
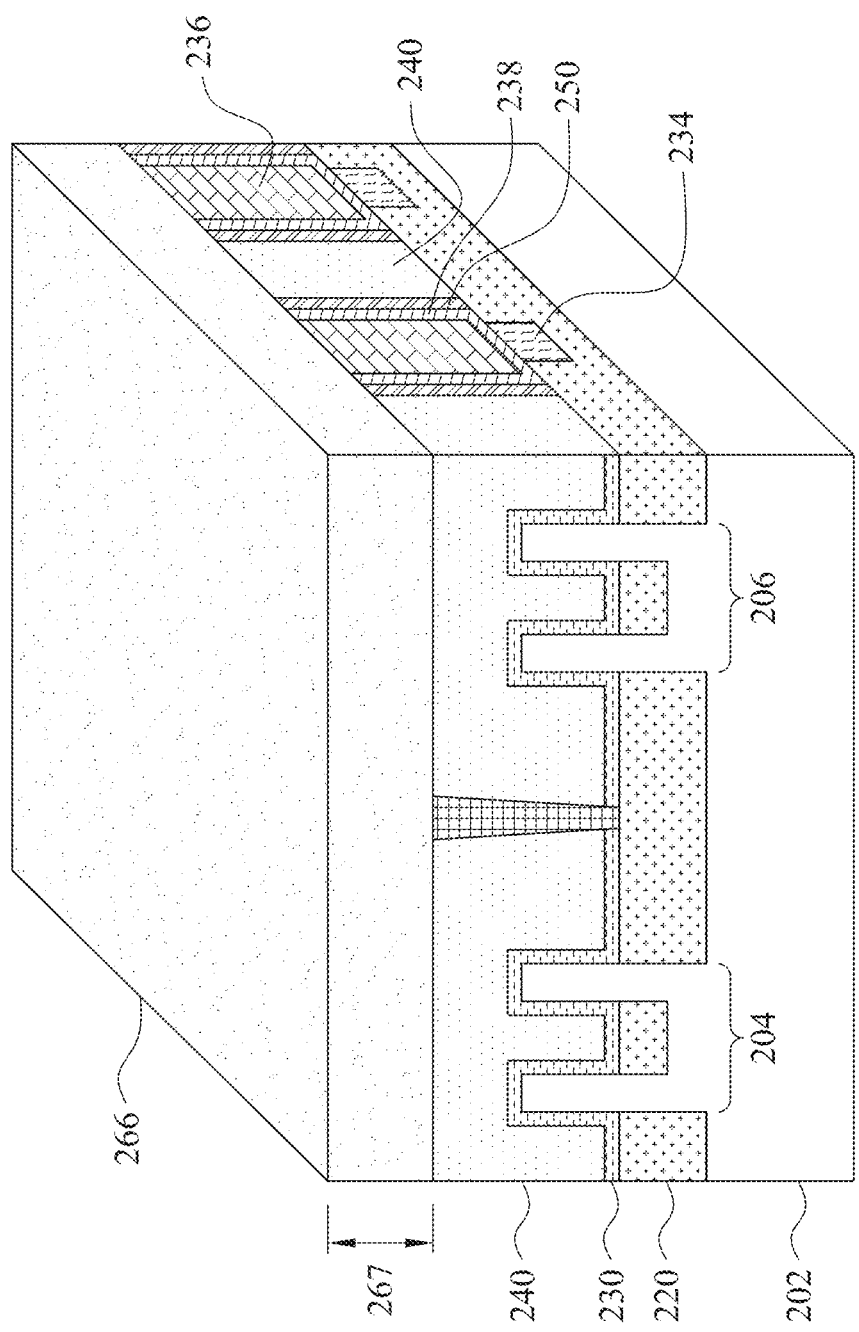
FIGS. 4A-4C are different views of a processing step.
Figure 4C:
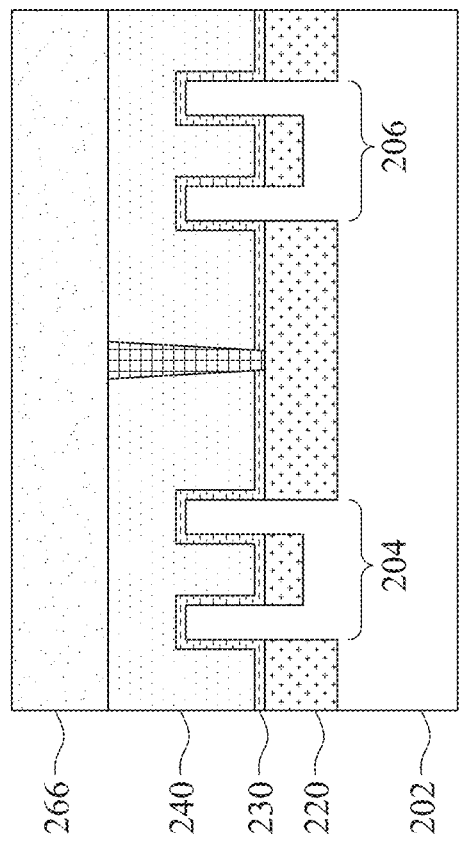
Figure 4B:
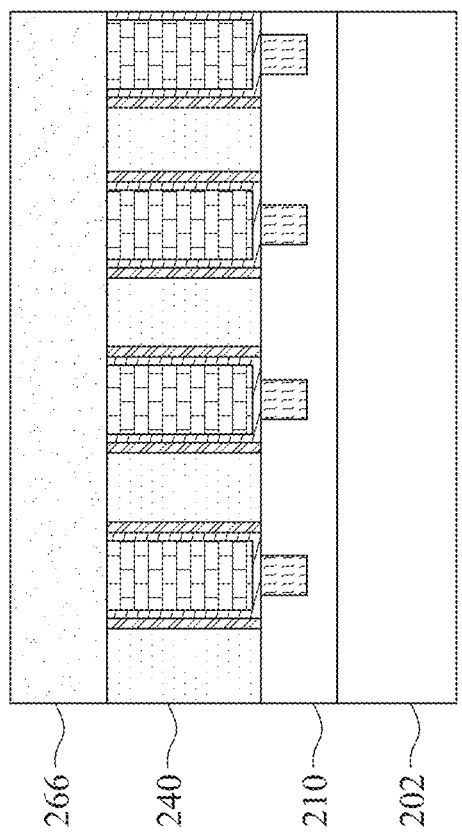

In optional step 110, a new hard mask layer 266 having thickness 267 is applied upon the dummy gate regions 240 and the ILD regions 236. The resulting structure is shown in FIGS. 4A-4C. In some embodiments, the thickness 267 of the hard mask layer is from about 600 angstroms to about 900 angstroms, or from about 700 angstroms to about 800 angstroms.

Figure 5A:
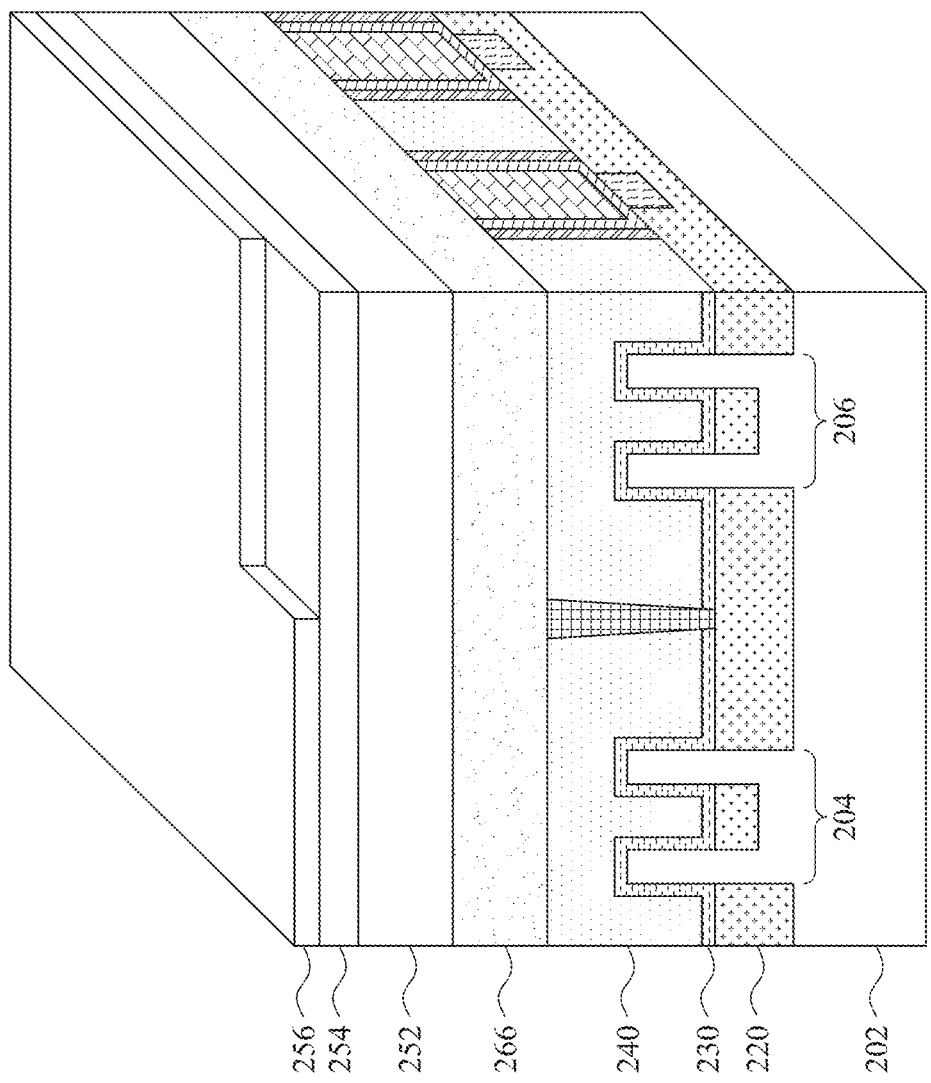
FIGS. 5A-5C are different views of a processing step.
Figure 5B:
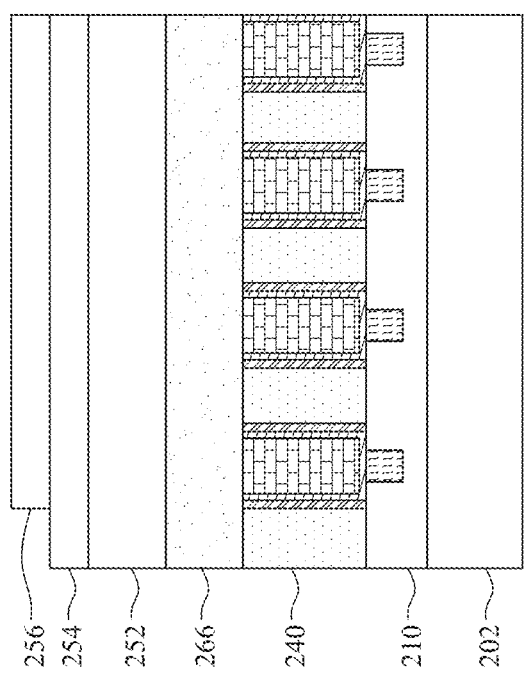
Figure 5C:
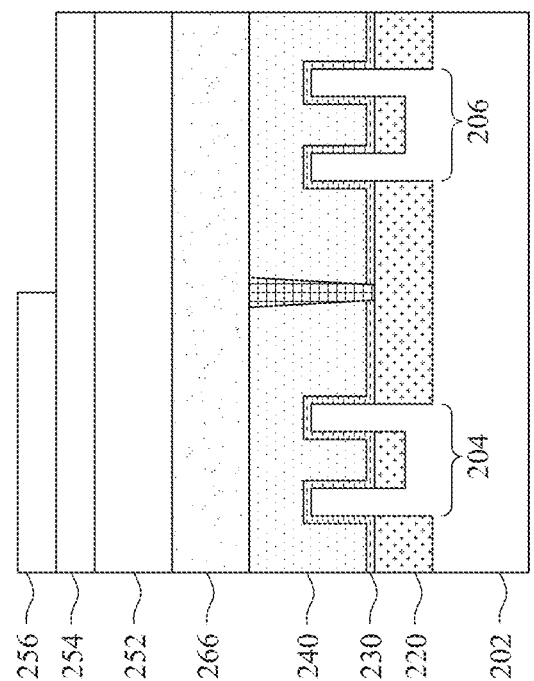

Next, referring to FIGS. 5A-5C, in optional step 115, a bottom layer 252 is applied over the hard mask layer 266. A spin-on-carbon (SoC) material is suitable for the bottom layer. In optional step 120, a middle layer 254 is applied over the bottom layer 252. A spin-on-glass material is commonly used for the middle layer. When used, the combination of the hard mask layer, the bottom layer, and the middle layer results in a tri-layer patterning etch system, which allows for better control of subsequent etching.

Next, in step 125, a photoresist (PR) layer 256 is applied and patterned. The photoresist layer may be applied, for example, by spin coating, or by spraying, roller coating, dip coating, or extrusion coating. The photoresist can be baked or cured to remove solvent and harden the photoresist layer. The photoresist is then exposed to patterned light, and then developed to obtain the patterned photoresist layer. In particular embodiments, extreme ultraviolet (EUV) light having a wavelength of about 13.5 nm is used for patterning, as this permits smaller feature sizes to be obtained. Referring again to FIGS. 5A-5C, it can be seen that the PR layer 256 is patterned such that fin pair 204 is protected, while fin pair 206 is exposed. If the bottom layer and middle layer are not used, then the PR layer would be applied to the hard mask layer 266.

Next, in optional step 127, dry etching is performed to etch through the middle layer 254 and the bottom layer 252 using appropriate etchants. In step 130, dry etching is performed to etch through the hard mask layer 266 and expose the dummy gate region 242. This may be referred to as Hard Mask Open (HMO).

Generally, any dry etching step used herein may be performed using plasma etching processes such as reactive ion etching (RIE) or inductively coupled plasma (ICP), or combinations thereof, as appropriate. The etching may be anisotropic. Depending on the material, etchants may include carbon tetrafluoride ($CF_4$), hexafluoroethane ($C_2F_6$), octafluoropropane ($C_3F_8$), fluoroform ($CHF_3$), difluoromethane ($CH_2F_2$), fluoromethane ($CH_3F$), trifluoromethane ($CHF_3$), carbon fluorides, nitrogen ($N_2$), hydrogen ($H_2$), oxygen ($O_2$), argon (Ar), xenon (Xe), xenon difluoride ($XeF_2$), helium (He), carbon monoxide (CO), carbon dioxide ($CO_2$), fluorine ($F_2$), chlorine ($Cl_2$), oxygen ($O_2$), hydrogen bromide (HBr), hydrofluoric acid (HF), nitrogen trifluoride ($NF_3$), sulfur hexafluoride ($SF_6$), boron trichloride ($BCl_3$), ammonia ($NH_3$), bromine ($Br_2$), or the like, or combinations thereof in various ratios.

Figure 6A:
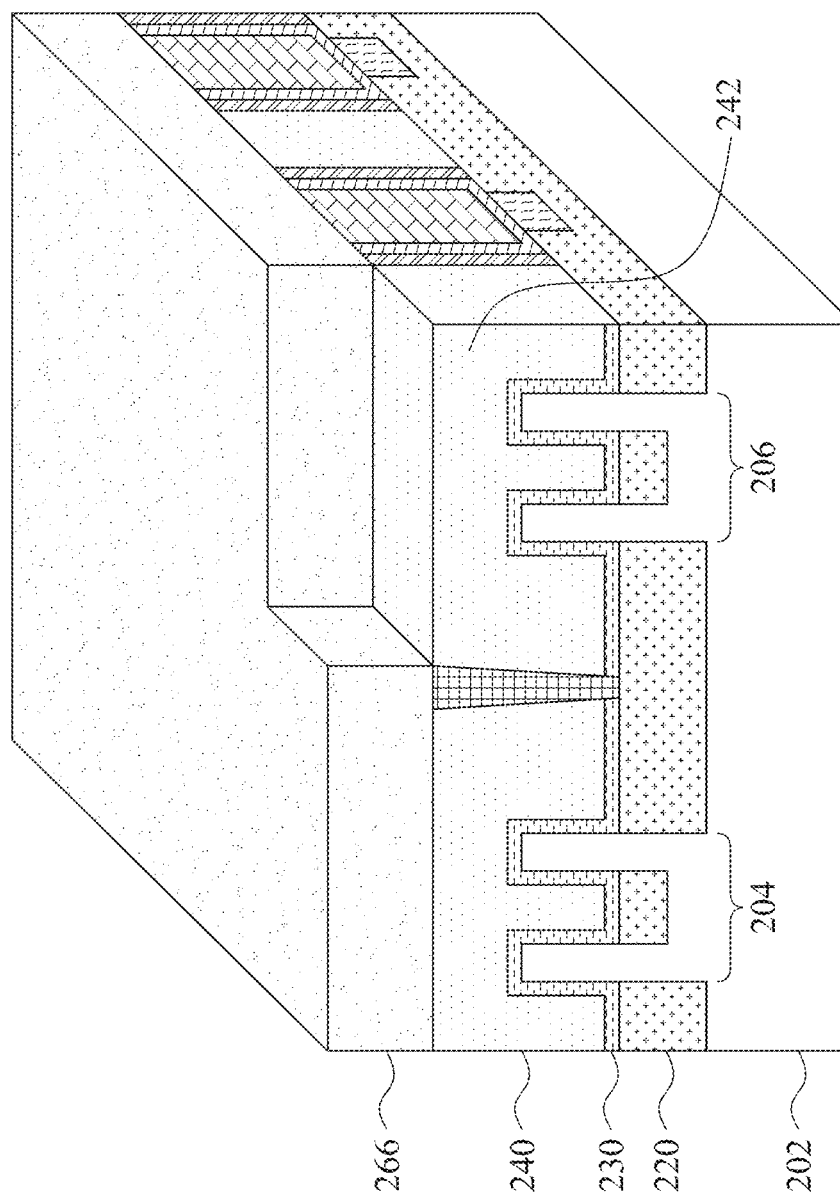
FIGS. 6A-6C are different views of a processing step.
Figure 6B:
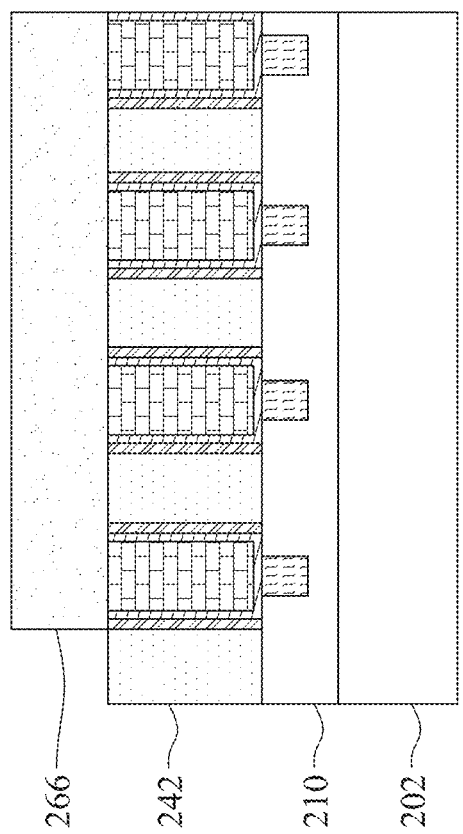
Figure 6C:
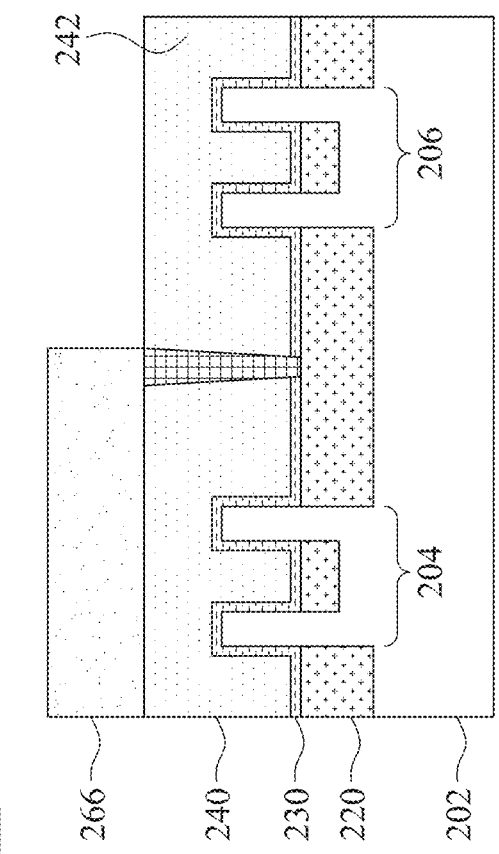

In step 135, the PR layer 256 is removed. In optional step 140, the middle layer 254 is removed. In optional step 145, the bottom layer 252 is removed. The resulting structure is shown in FIGS. 6A-6C. As can be seen here, dummy gate region 242 above fin pair 206 is exposed.

In optional step 150, wet cleaning is performed. The cleaning solution will depend on the etch recipe and the exposed layers. Examples of cleaning solutions may include deionized water, dilute HF, and other conventional solutions.

Figure 7A:
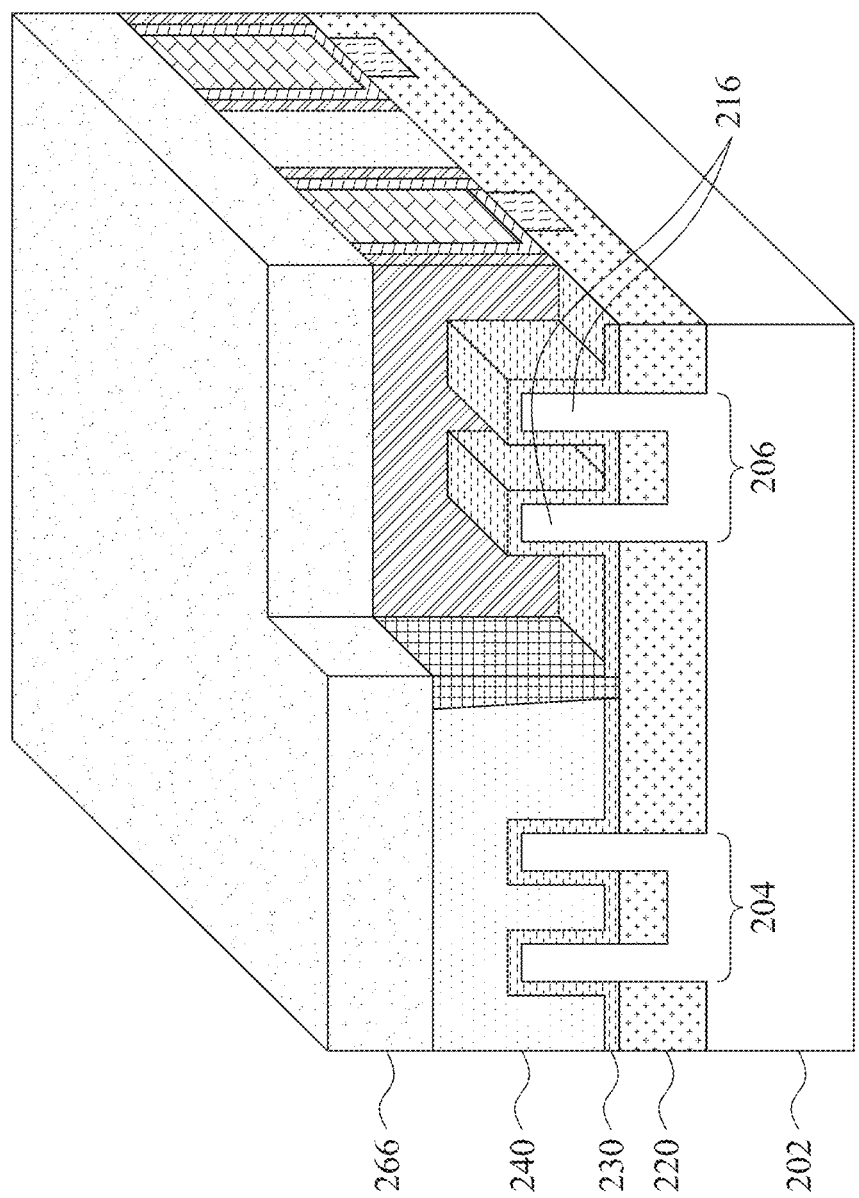
FIGS. 7A-7C are different views of a processing step.
Figure 7B:
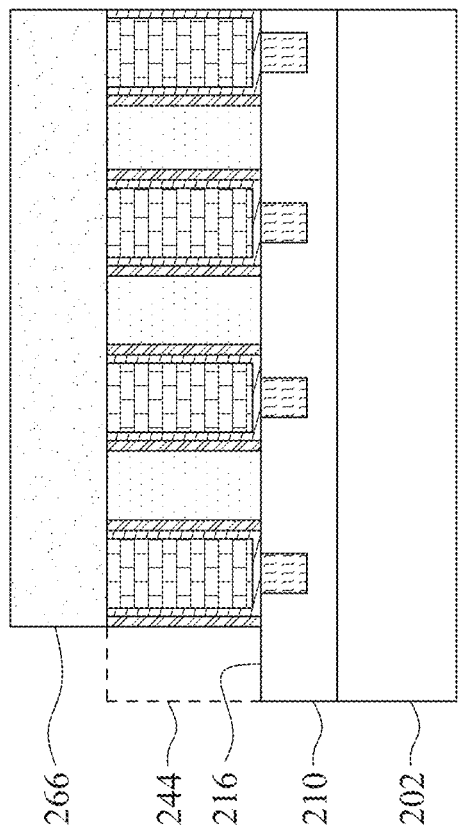
Figure 7C:
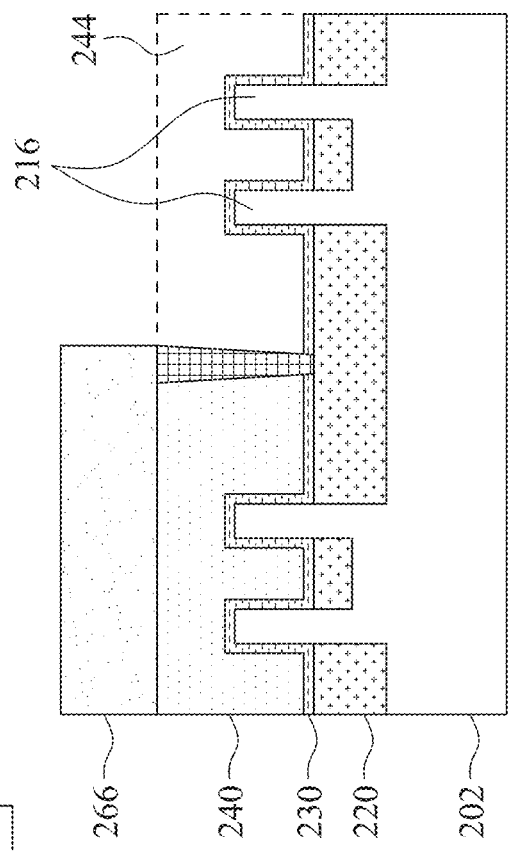

Next, in step 155, the exposed dummy gate region 242 is removed by etching. Referring back to FIG. 2C, the dummy gate region is located between two isolation dielectric regions 232. The dummy gate region is also located above fin pair 206, and etching away the dummy gate region exposes portions 216 of the fins, along with the I/O oxide layer on those exposed portions 216 of the fins. The resulting structure is shown in FIGS. 7A-7C. The empty dummy gate region may also be referred to as a gate volume 244 (indicated in dashed lines). When the dummy gate region is formed from polysilicon, suitable etchants may include $BCl_3$, $Cl_2$, $SiCl_4$, HCl, $O_2$, HBr, $SF_6$, and/or $NF_3$, in appropriate combinations and ratios.

Figure 8A:
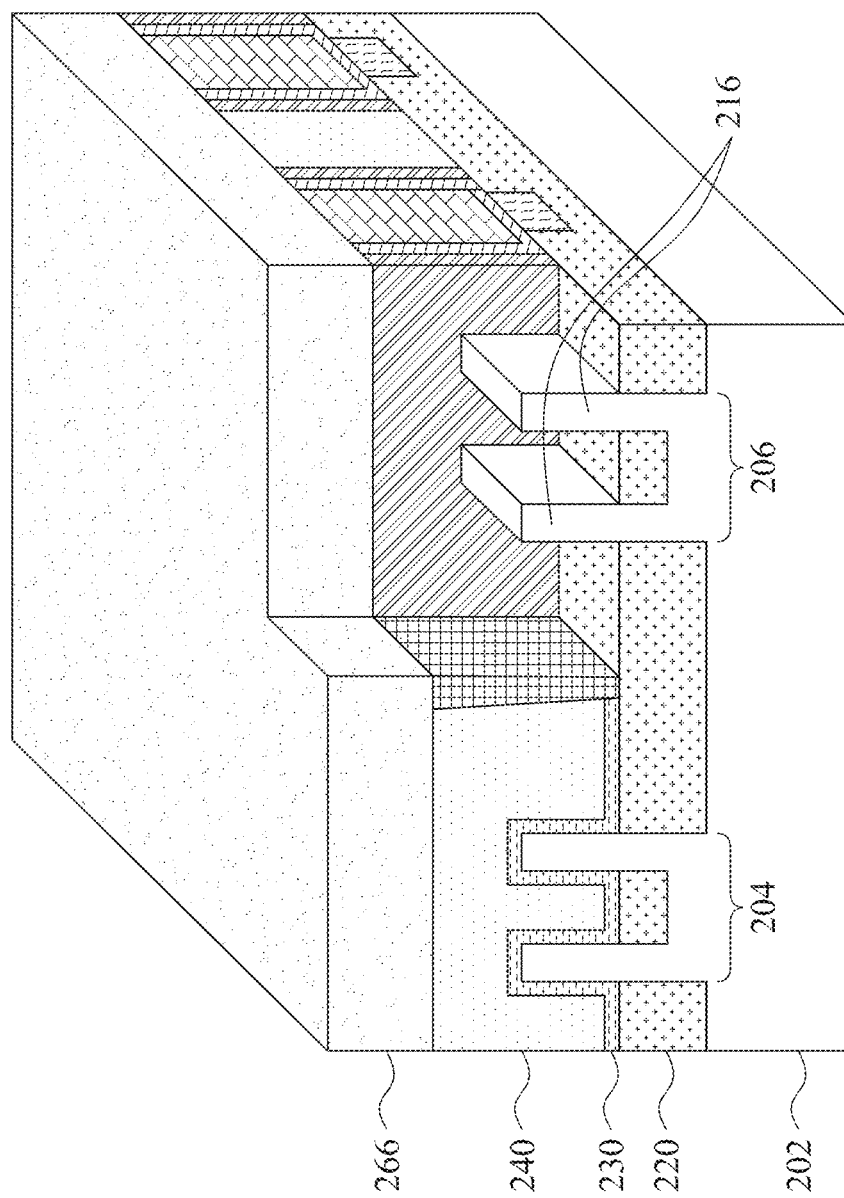
FIGS. 8A-8C are different views of a processing step.
Figures 8B, 8C:
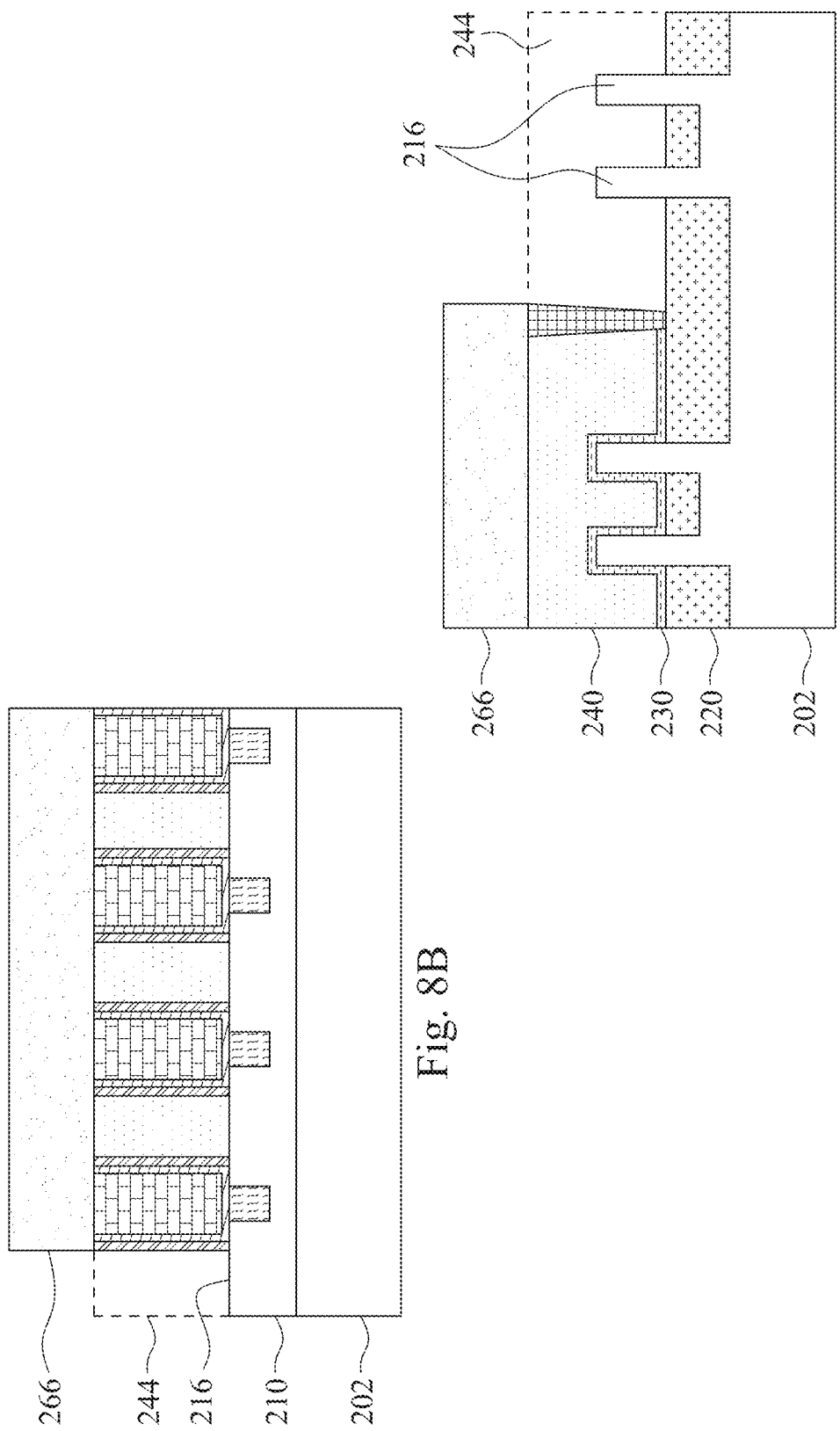

In optional step 160, wet cleaning is performed again. In step 165, the I/O oxide layer is removed from the exposed portions 216 of the pair of fins. The resulting structure is shown in FIGS. 8A-8C. In optional step 170, wet cleaning is performed again.

Figure 9A:
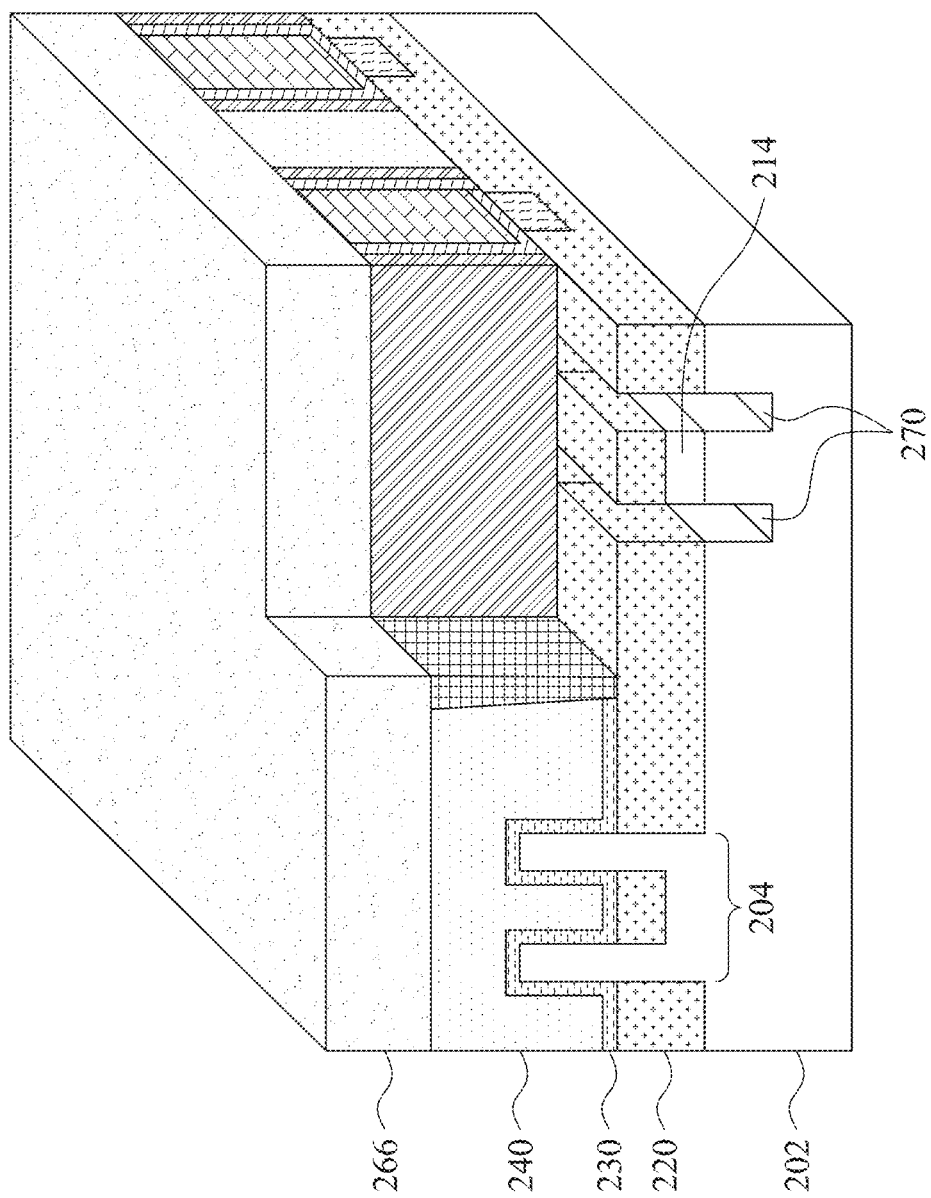

Next, referring to FIGS. 9A-9C, in steps 175 and 180, the exposed portions of the fins are etched away, and a pair of trenches 270 is formed in the substrate 202 in the same location as the exposed portions of the fins. It is noted that the extra material 214 located between the fins still remains below the STI layer 220, and can form a leakage path for leakage current. The etching of the fins and substrate is performed by dry etching, desirably plasma etching, and cycles between two different etchants. In step 175, a first etchant is used, and in step 180, a second different etchant is used. The etching cycles back and forth between these two etchants until the desired result is achieved, as indicated with reference numeral 182.

The first etchant can be referred to as a fin etchant, and is selective for the material from which the fins and the substrate are made. In some embodiments, the fin etchant is selective for silicon. Such etchants may include HBr, $NF_3$, $O_2$, $CF_3Br$, $BCl_3$, and/or $Cl_2$, in appropriate combinations and ratios. During etching with the first etchant, many different byproducts can be formed which can be redeposited upon the exposed portions of the fins and the substrate and act as a protective layer, stopping the etching process. Thus, the second etchant is used to remove the deposited byproducts and re-expose the fins and the substrate. In particular embodiments, the second etchant comprises argon, and may also include other gases for removing the byproducts, such as other fluoride-containing molecules like $CF_4$.

As illustrated in FIG. 1, the etching is performed by cycling between the first etchant and the second etchant. In some particular embodiments, the cycling occurs at least five (5) times, and usually less than 10 times. Parameters such as the etchant pressure, chamber temperature, cycle time, etc. may be controlled or vary between each etching as desired to obtain the desired result and to control the etching. Very generally, the cycle time for each etchant may range from about 5 seconds to about 60 seconds. However, in particular embodiments, the cycle time for the first etchant will be greater than the cycle time for the second etchant. In this regard, the second etchant is not as selective as the first etchant, and will also etch the fins and the substrate. If the etching with the second etchant is too short, byproducts will remain. However, if the etching with the second etchant is too long, then the critical dimension (CD) will be too large. It is noted that besides etching away the fins, the extra material located below the STI layer can be significantly removed or even totally eliminated, which significantly reduces leakage current through this path. FIGS. 9A-9C show the result after the etching is complete, and the trenches 270 have been formed.

Figure 10A:
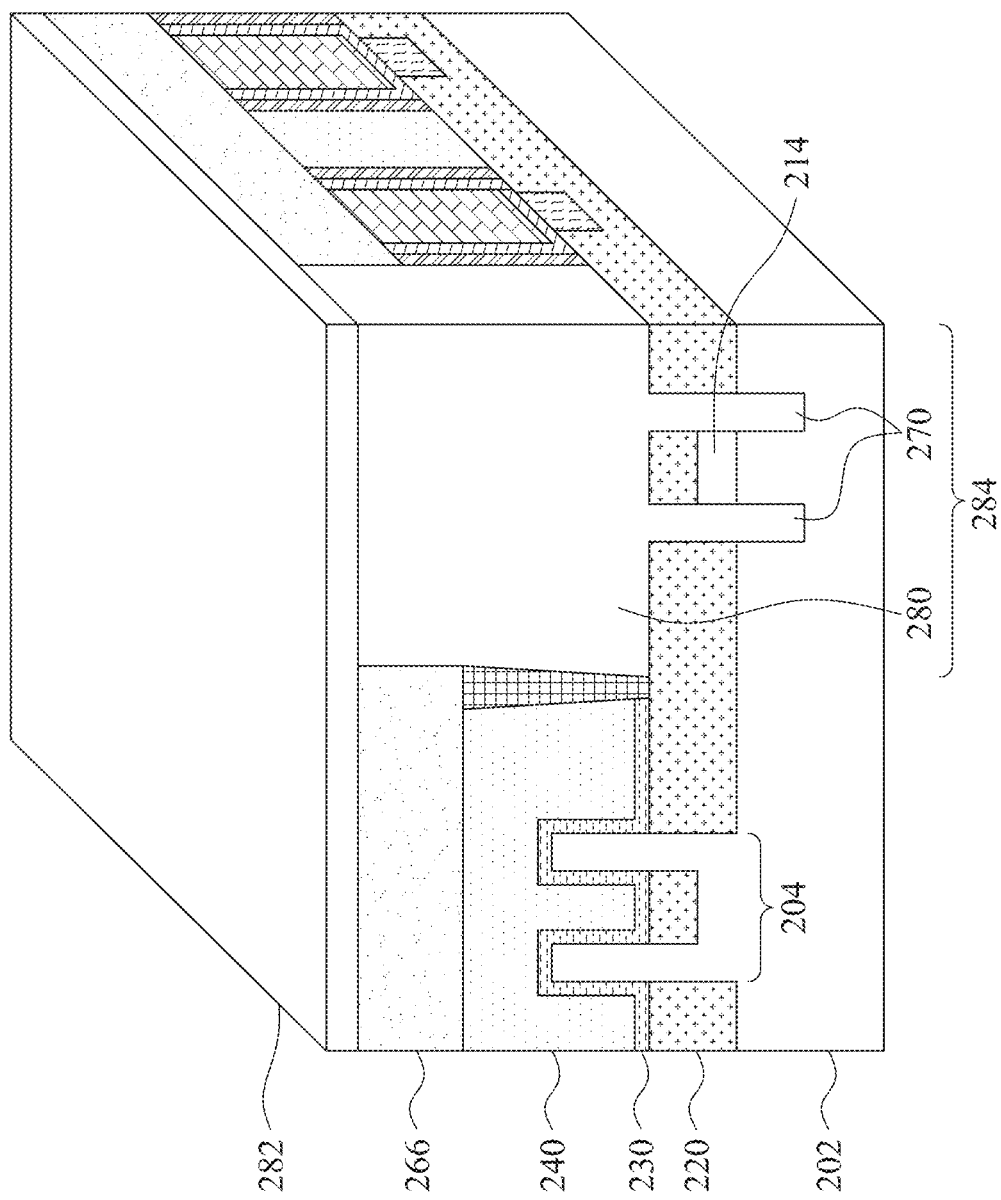

In optional step 185, wet cleaning is performed again. In step 190, the pair of trenches 270 and the empty gate volume 244 are filled with a dielectric material 280 to form the CPODE structure 284. Any low-k dielectric material having a dielectric constant equal to or less than that of silicon nitride (~7) can be used. In some particular embodiments, the dielectric material comprises silicon nitride, a silicon oxide, or combinations thereof. The dielectric material can be deposited using CVD, PVD, or ALD, although CVD is commonly used due to the high aspect ratio needed for the deposition. The dielectric material may also form a dielectric layer 282 over the hard mask layer 266. FIGS. 10A-10C show the resulting structure.

Figure 11A:
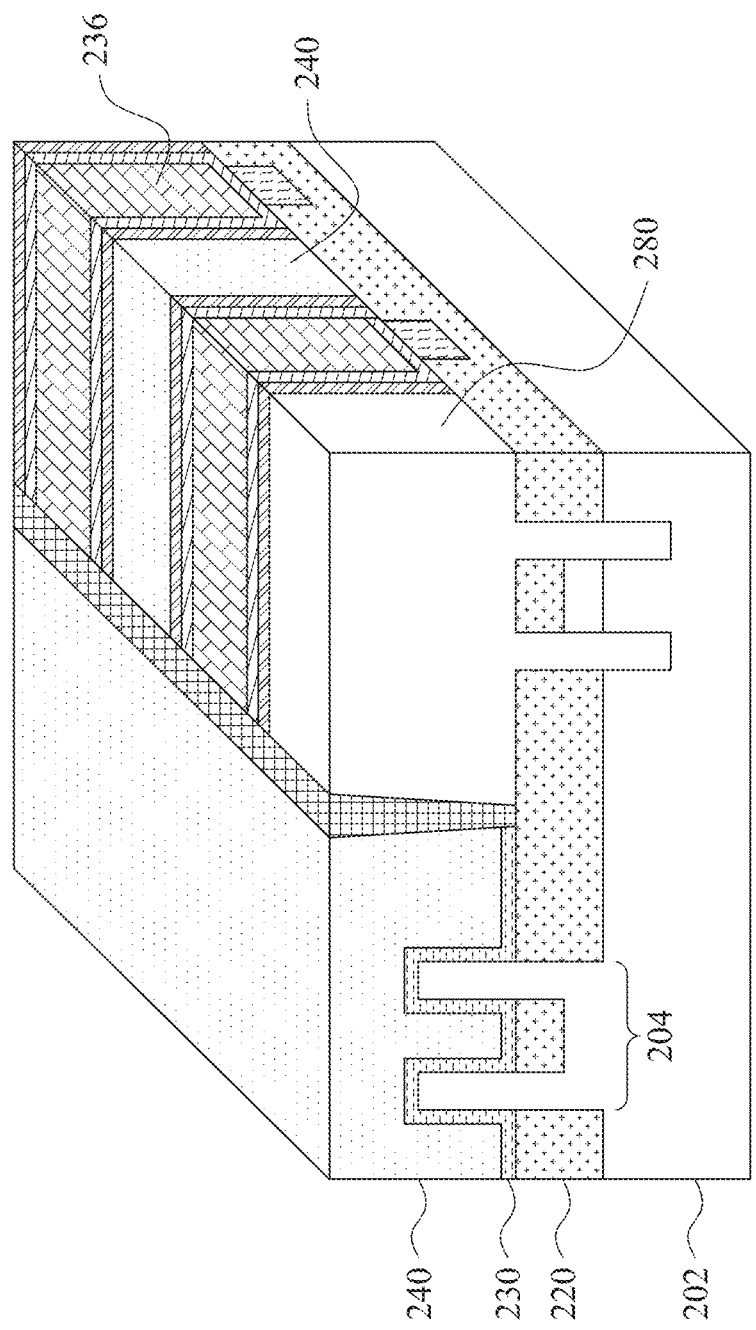

In step 195, the integrated circuit is planarized to remove the hard mask layer 266. If present, the dielectric layer 282 is also removed. This planarization may be performed, for example, using CMP. FIGS. 11A-11C show the resulting structure. As seen here, the remaining dummy gate regions 240 and ILD regions 236 are thus exposed.

The substrate may be further processed to obtain the desired integrated circuit. For example, the various dummy gate regions may be removed and then filled with, for example, a metal gate.

Figure 12A:
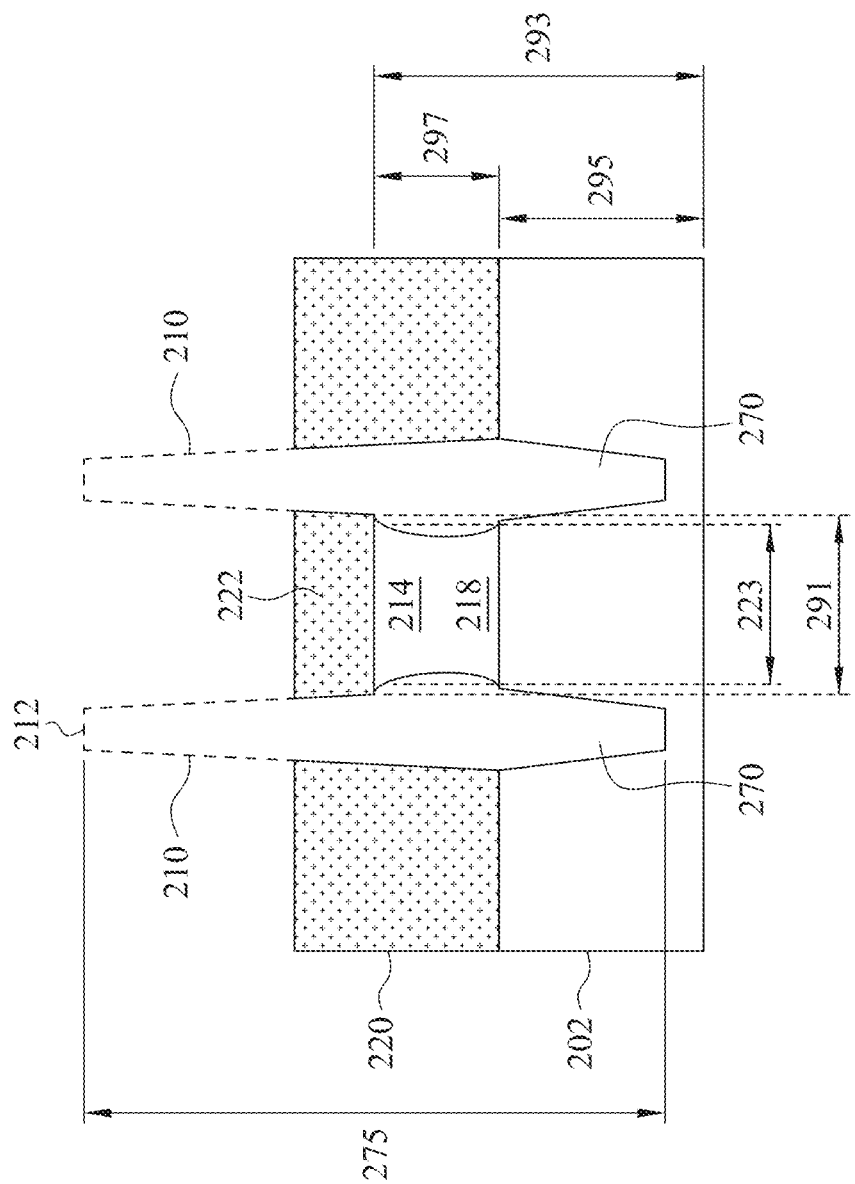
FIG. 12A is a magnified Y-axis view showing the fins and trenches in more detail.

FIG. 12A is a magnified view for providing extra details related to the substrate 202, the STI layer 220, and the trenches 270. Initially, it is noted that while the fins 210 in FIGS. 2A-11C are illustrated as having rectangular shapes, they are typically wider at their base than at their peak, which is caused by reduced etching ability between the pairs of fins due to their small dimensions and reduced accessibility to the etchant. Similarly, for the trenches 270, the reduced accessibility to the etchant causes the trenches to typically be wider at their peak than at their base.

The depth 275 of the trench is typically measured from the peak 212 of the fin 210, because the fin must be etched away before the trench can be etched. The fin is shown here in dotted line. In some particular embodiments, the depth 275 of the trench is from about 145 nanometers to about 185 nm.

Continuing, the portion of the STI layer 222 located between the trenches 270 has a bottom width 223. The extra material 214 located between the fins should also be considered part of the substrate 202, and has a top width 291. During the etching that forms the trenches, the sides of the extra material 214 are also etched away. Thus, in some embodiments, the bottom width 223 of the STI layer located between the trenches is greater than the top width 291 of the substrate between the trenches 270. These two values are measured where the STI layer and the substrate meet.

As previously mentioned, the extra material 214 can form a leakage path for leakage current. Due to the presence of the trenches and the dielectric material therein, the extra material 214 becomes a depletion region due to diffusion of charge carriers into the source/drain regions and out of the extra material. As a result, leakage current through this path is reduced or eliminated.

Figure 12C:
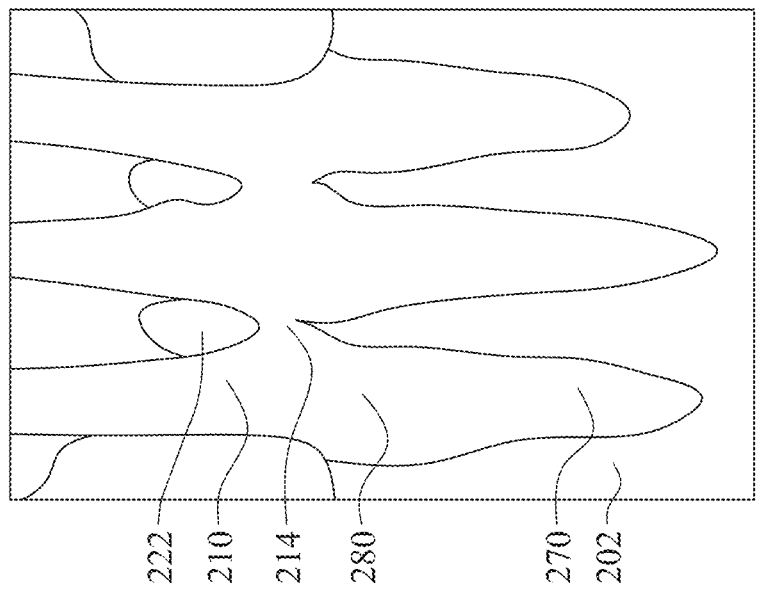
FIG. 12C is a magnified Y-axis line drawing of another example CPODE structure. Here, the depletion region between the trenches has been completely removed.
Figure 12B:
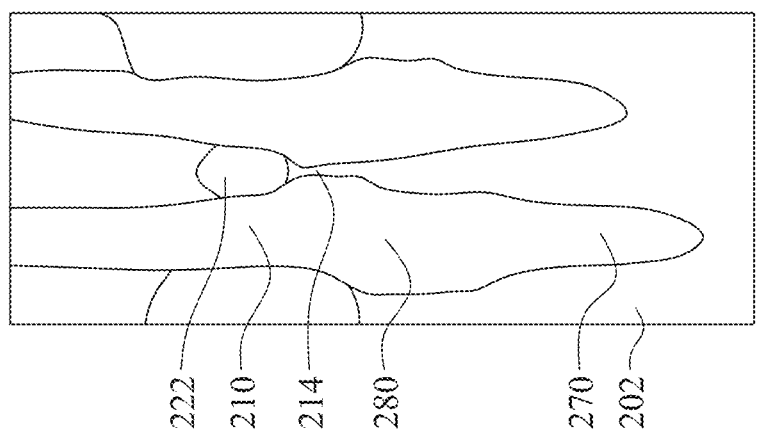
FIG. 12B is a magnified Y-axis line drawing of one example CPODE structure. Here, the size of the depletion region between the trenches is much smaller in size.

FIG. 12B is a line drawing of one example of a CPODE structure formed according to the present disclosure. Here, the trenches 270 are shown, along with the STI layer 222 between the trenches and the substrate 202. The trenches are filled with the dielectric material 280. The previously-existing fins 210 are also shown here for reference. As can be seen here, the sides of the extra material 214 have been etched away significantly, such that the physical size of the depletion region is also reduced, further reducing the amount of leakage current that can pass through the depletion region. The dielectric material fills a portion of the volume below the STI layer that was occupied by the extra material.

FIG. 12C is a line drawing of another example of a CPODE structure formed according to the present disclosure. In this example, there are three trenches 270. Here, the extra material has been completely eliminated, and the dielectric material 280 is present in a volume below the STI layer 222 between the trenches. In this embodiment, the bottom width 223 of the STI layer located between the trenches is greater than the top width 291 of the substrate between the trenches, which would be zero. Put another way, the dielectric material completely separates the substrate from the STI layer in the region between adjacent pairs of trenches.

The thickness of the substrate between the pair of trenches is indicated with reference numeral 293. The thickness of the substrate outside the pair of trenches is indicated with reference numeral 295. The difference between these two values may be referred to as the depth of the substrate between the pair of trenches, and is indicated with reference numeral 297. In particular embodiments, the depth of the substrate between the pair of trenches is from about 5 nm to about 16 nm. This depth may also be referred to as the STI-Si gap.

Figure 13:
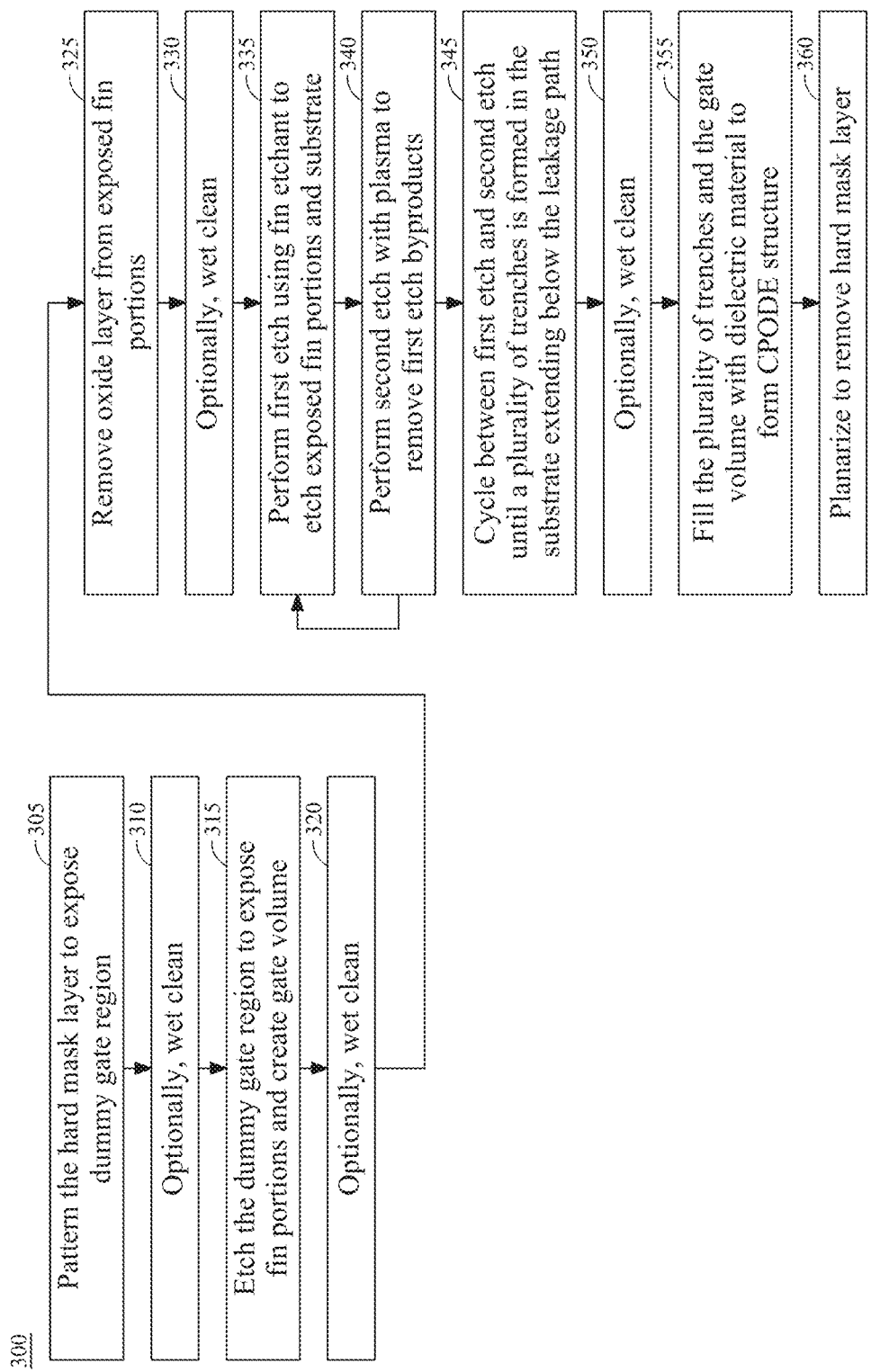
FIG. 13 is a flow chart illustrating a method for isolating a leakage path below a shallow trench isolation region, in accordance with some embodiments.

FIG. 13 is a flow chart illustrating a method 300 for isolating a leakage path located below a shallow trench isolation (STI) region, in accordance with some embodiments. The various method steps can also be understood by referring to FIGS. 2A-11C.

Initially, referring to FIG. 12A, the leakage path is indicated with reference numeral 218, and is located below STI region 222. Then, the method of FIG. 13 begins in step 305 with patterning a hard mask layer. Referring to FIGS. 6A-6C, this is done by applying and patterning a photoresist layer, and then etching through the hard mask layer 266. As a result, a dummy gate region 242 is exposed.

In optional step 310, wet cleaning is performed. Next, in step 315, the exposed dummy gate region 242 is removed by etching. The resulting structure is shown in FIGS. 7A-7C. As a result, portions 216 of the pair of fins 210 located on opposite sides of the leakage path 218 are exposed.

In optional step 320, wet cleaning is performed again. In step 325, the I/O oxide layer is removed from the exposed portions 216 of the pair of fins. The resulting structure is shown in FIGS. 8A-8C. In optional step 330, wet cleaning is performed again.

Next, in step 335, a first etch is performed using a fin etchant to etch away the exposed portions 216 of the fin. Then, in step 340, a second etch is performed with plasma to remove any byproducts of the first etch. In particular embodiments, the first etch is a silicon etch and the second etch is an argon plasma etch. Referring to FIGS. 9A-9C, the etching process cycles between these two etches, as indicated with reference numeral 345, until a pair of trenches 270 is formed in the substrate 202. The trenches 270 extend into the substrate below the leakage path 218. The etching cycle is then complete.

In optional step 350, wet cleaning is performed again. In step 355, the trenches 270 are filled with a dielectric material 280 to form the CPODE structure. The empty gate volume 244 is also filled. The resulting structure is shown in FIGS. 10A-10C.

In step 360, planarization is performed to remove the hard mask layer 266. The dummy gate regions 240 and the ILD regions 236 are also exposed for further processing. The resulting structure is shown in FIGS. 11A-11C.

Figure 14:
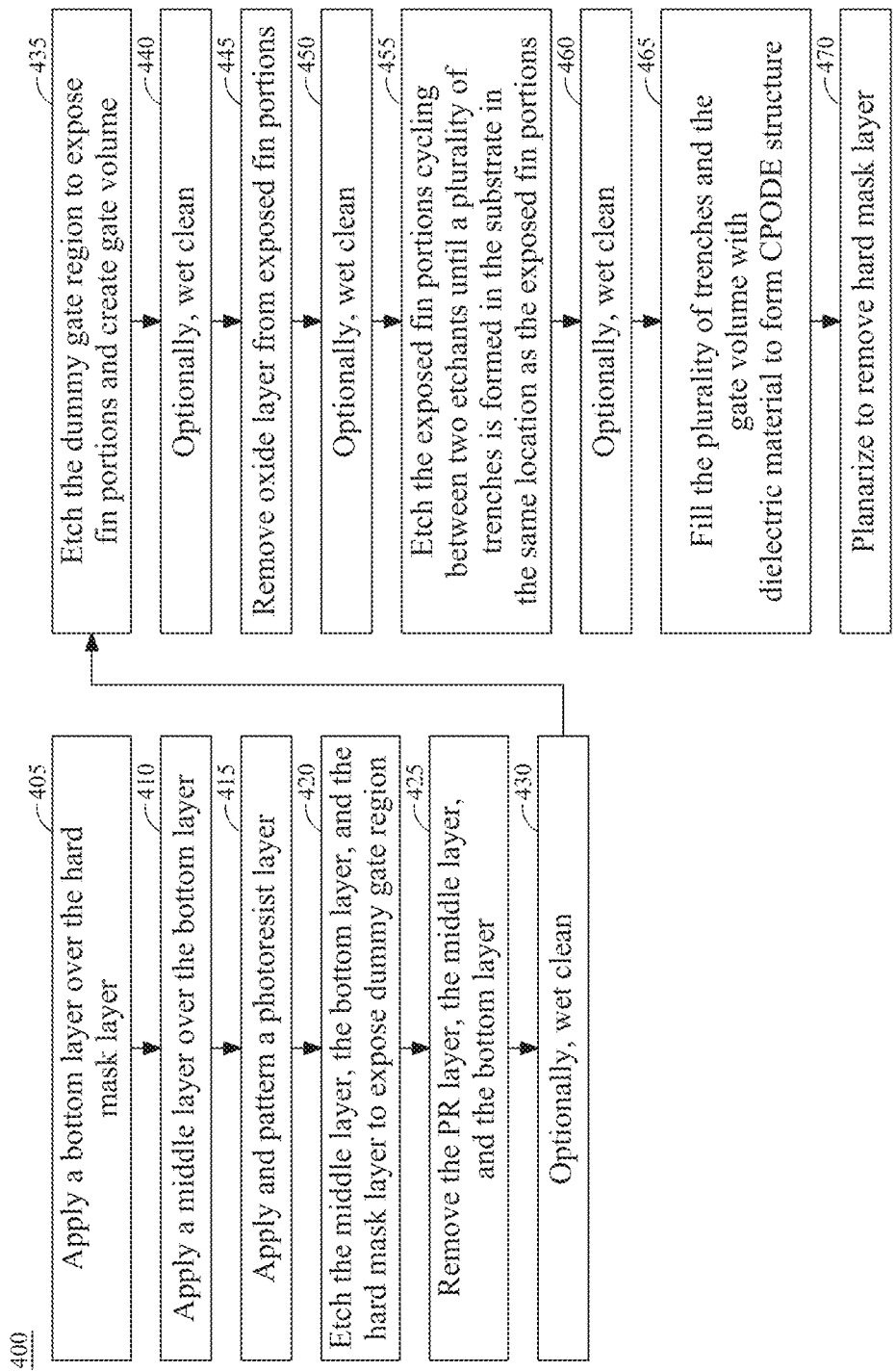
FIG. 14 is a flow chart illustrating a method for forming a CPODE structure, in accordance with some embodiments.

FIG. 14 is a flow chart illustrating a method 400 for forming a CPODE structure, in accordance with some embodiments. The various method steps can also be understood by referring to FIGS. 2A-11C.

Initially, the method begins with the wafer substrate as shown in FIGS. 4A-4C. In step 405, a bottom layer 252 is applied over the hard mask layer 266. In step 410, a middle layer 254 is applied over the bottom layer 252. In step 415, a photoresist (PR) layer 256 is applied and patterned. The resulting structure is seen in FIGS. 5A-5C.

Next, in step 420, the middle layer, the bottom layer, and the hard mask layer are etched through to expose a dummy gate region 242. In step 425, the PR layer, the middle layer, and the bottom layer are removed. The resulting structure is seen in FIGS. 6A-6C.

In optional step 430, wet cleaning is performed. Next, in step 435, the exposed dummy gate region 242 is etched to expose portions 216 of a pair of fins 210. The resulting structure is shown in FIGS. 7A-7C.

In optional step 440, wet cleaning is performed again. In step 445, an oxide layer is removed from the exposed portions 216 of the pair of fins. The resulting structure is shown in FIGS. 8A-8C. In optional step 450, wet cleaning is performed again.

Next, in step 455, the exposed portions 216 of the pair of fins are etched until a pair of trenches 270 is created in the substrate 202 in the same location as the exposed portions of the pair of fins. The resulting structure is shown in FIGS. 9A-9C. The etching is performed by cycling between a first etchant and a second etchant (previously described above). The first etchant is selective for the fins and the substrate. The second etchant is used to remove byproducts produced during the etching by the first etchant. In some particular embodiments, the first etchant is a silicon etchant, and the second etchant comprises argon.

In optional step 460, wet cleaning is performed again. In step 465, the trenches 270 and the gate volume 244 are filled with a dielectric material 280 to form the CPODE structure. The resulting structure is shown in FIGS. 10A-10C.

Finally, in step 470, planarization is performed to remove the hard mask layer 266. The resulting structure is shown in FIGS. 11A-11C.

Referring back to FIGS. 11A-11C, the resulting integrated circuit 200 advantageously has a CPODE structure with reduced leakage current, as illustrated in several embodiments in the present disclosure. The extra material 214 (previously located between the etched-out pair of fins) becomes a depletion region or even an inversion region due to diffusion of charge carriers from the source/drain regions, and as a result reduced leakage current passes through the extra material 214. The conductive channel previously provided by the extra material is eliminated, and may also be etched to reduce its physical size too.

Some embodiments of the present disclosure thus relate to methods for reducing leakage current in an integrated circuit. A hard mask layer is patterned to expose a dummy gate region located above a pair of fins and between two isolation dielectric regions. The dummy gate region between the two isolation dielectric regions is removed to expose portions of the pair of fins and form a gate volume. An oxide layer on the exposed portions of the pair of fins is removed. The pair of fins are removed to create a pair of trenches in a substrate below an STI layer. Extra material located between the pair of fins and below the STI layer is also removed. This is done by cycling between etching with a substrate etchant and etching with argon plasma. The pair of trenches and the gate volume are then filled with a dielectric material such that the dielectric material either partially or completely separates the substrate from the STI layer.

Other embodiments of the present disclosure also relate to methods for isolating a depletion region below a shallow trench isolation (STI) region. A first etch is performed with an etchant to etch away exposed portions of a pair of fins located on opposite sides of the leakage path. A second etch is performed with plasma to remove any byproducts of the first etch. Cycling between the first etch and the second etch continues until a pair of trenches is formed in a substrate, wherein the trenches extend below the depletion region. The pair of trenches is then filled with a dielectric material to isolate the depletion region from the STI region.

Other embodiments of the present disclosure also relate to methods for forming a CPODE structure. A bottom layer and a middle layer are applied over a hard mask layer. A photoresist layer is applied over the middle layer and patterned. Etching through the middle layer, the bottom layer, and the hard mask layer is performed to expose a dummy gate region. The dummy gate region is etched to expose portions of a pair of fins. The exposed portions of the pair of fins are dry etched until a pair of trenches is created in a substrate in the same location as the exposed portions of the pair of fins. The dry etching is performed by cycling between a first etchant that is selective for the fins and a second different etchant for removing byproducts produced by the first etchant. The pair of trenches and the etched dummy gate region are filled with a dielectric material.

The present disclosure also relates to a wafer substrate or integrated structure or semiconductor device that includes a CPODE structure. The CPODE structure includes a pair of trenches extending into the substrate that surrounds a leakage path or depletion region running along an X-axis. The leakage path or depletion region is located below an STI region located between the pair of trenches. The CPODE structure also includes a gate volume that runs in the Y-axis and is located above the substrate and above the pair of trenches. The pair of trenches and the gate volume are filled with a dielectric material. The dielectric material also fills a volume below the STI layer, or in other words between the STI layer and the substrate. The dielectric material can completely replace the depletion region, joining the pair of trenches together in the volume below the STI layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for reducing leakage current in an integrated circuit, comprising:
    patterning a hard mask layer to expose a dummy gate region located above a pair of fins and between two isolation dielectric regions, wherein extra material is located between the pair of fins, wherein the extra material is a difference between a thickness of a substrate between the pair of fins and a thickness of the substrate outside the pair of fins;
    removing the dummy gate region between the two isolation dielectric regions to expose portions of the pair of fins and form a gate volume;
    removing an oxide layer on the exposed portions of the pair of fins;
    cycling between etching with a substrate etchant and etching with argon plasma, to remove the exposed portions of the pair of fins, and remove the extra material located between pair of fins and below an STI layer, and create a pair of trenches in the substrate; and
    filling the pair of trenches and the gate volume with a dielectric material, such that the dielectric material separates the substrate from the STI layer.

2. The method of claim 1, wherein the cycling occurs at least 5 times.

3. The method of claim 1, wherein the pair of trenches and the gate volume are filled with the dielectric material using atomic layer deposition.

4. The method of claim 1, further comprising wet cleaning after the hard mask layer is patterned, or after the dummy gate region is removed, or after the oxide layer is removed, or after the cycling occurs.

5. The method of claim 1, further comprising planarizing the integrated circuit to remove the hard mask layer.

6. The method of claim 1, further comprising applying a bottom layer and a middle layer to the hard mask layer prior to patterning the hard mask layer.

7. The method of claim 1, wherein a bottom width of the STI layer between the pair of trenches is greater than a top width of the substrate between the pair of trenches.

8. The method of claim 1, wherein a depth measured from a peak of the pair of fins to a bottom of the pair of trenches is from about 145 nm to about 185 nm; or
    wherein a depth of the substrate between the pair of trenches is from about 5 nm to about 16 nm.

9. The method of claim 1, wherein the extra material is completely removed, such that the dielectric material completely separates the substrate from the STI layer in a region between the pair of trenches.

10. The method of claim 1, wherein the hard mask layer comprises silicon nitride.

11. The method of claim 1, wherein the isolation dielectric regions comprise silicon nitride or a silicon oxide.

12. The method of claim 1, wherein the dummy gate region comprises polysilicon.

13. The method of claim 1, wherein the substrate comprises silicon.

14. The method of claim 1, wherein the STI layer comprises a silicon oxide.

15. The method of claim 1, wherein the dielectric material comprises a silicon oxide or silicon nitride.

16. A method for reducing leakage current in an integrated circuit, comprising:
    performing a first etch with an etchant to etch away exposed portions of a pair of fins located on opposite sides of a leakage path;
    performing a second etch with plasma to remove any byproducts of the first etch;
    cycling between the first etch and the second etch until a pair of trenches is formed in a substrate and a depletion region is removed, wherein the trenches extend below an STI region; and
    filling the pair of trenches with a dielectric material, wherein the dielectric material completely separates the substrate from the STI region in a region between the pair of trenches.

17. The method of claim 16, wherein the pair of fins comprise silicon.

18. The method of claim 16, wherein the second etch is performed with an argon plasma.

19. A method for reducing leakage current in an integrated circuit, comprising:
    exposing a dummy gate region located above a pair of fins and between two isolation dielectric regions;
    removing the exposed dummy gate region to expose portions of the pair of fins and form a gate volume;
    removing an oxide layer on the exposed portions of the pair of fins;
    using a first etchant and a second etchant to remove the exposed portions of the pair of fins, to remove extra material located between the pair of fins and below an STI layer, and to create a pair of trenches; and
    filling the pair of trenches and the gate volume with a dielectric material, wherein the dielectric material completely separates a substrate from the STI layer in a region between the pair of trenches.

20. The method of claim 19, further comprising cycling between the first etchant and the second etchant during usage.

* * * * *